(12) United States Patent
Parhi

(10) Patent No.: US 7,020,831 B2
(45) Date of Patent: Mar. 28, 2006

(54) PIPELINED ADD-COMPARE-SELECT CIRCUITS AND METHODS, AND APPLICATIONS THEREOF

(75) Inventor: Keshab K. Parhi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 487 days.

(21) Appl. No.: 10/318,250

(22) Filed: Dec. 13, 2002

(65) Prior Publication Data

US 2004/0117721 A1   Jun. 17, 2004

(51) Int. Cl.
*H03M 13/03* (2006.01)
(52) U.S. Cl. ...................................... 714/795
(58) Field of Classification Search ................ 714/786, 714/791, 794–796; 375/262, 341
See application file for complete search history.

(56) References Cited

U.S. PATENT DOCUMENTS

| | | | | |
|---|---|---|---|---|
| 4,606,027 A | * | 8/1986 | Otani | 714/795 |
| 5,418,795 A | * | 5/1995 | Itakura et al. | 714/746 |
| 6,111,835 A | * | 8/2000 | Honma | 369/59.13 |
| 6,148,431 A | | 11/2000 | Lee et al. | 714/794 |
| 6,212,664 B1 | * | 4/2001 | Feygin et al. | 714/796 |

* cited by examiner

*Primary Examiner*—Shelly Chase
(74) *Attorney, Agent, or Firm*—Sterne, Kessler, Goldstein & Fox PLLC

(57) ABSTRACT

Digital communications devices having high-speed add-compare-select circuits, and methods for designing the same. The add-compare-select circuits include logic segments separated by delay devices. The separation of the logic segments allows for pipelining of the add-compare-select processes and advantageous circuit retiming. The pipelining and advantageous circuit retiming permit the digital communications devices to be clocked at higher rates than similar digital communications devices having conventional add-compare-select circuits.

18 Claims, 26 Drawing Sheets

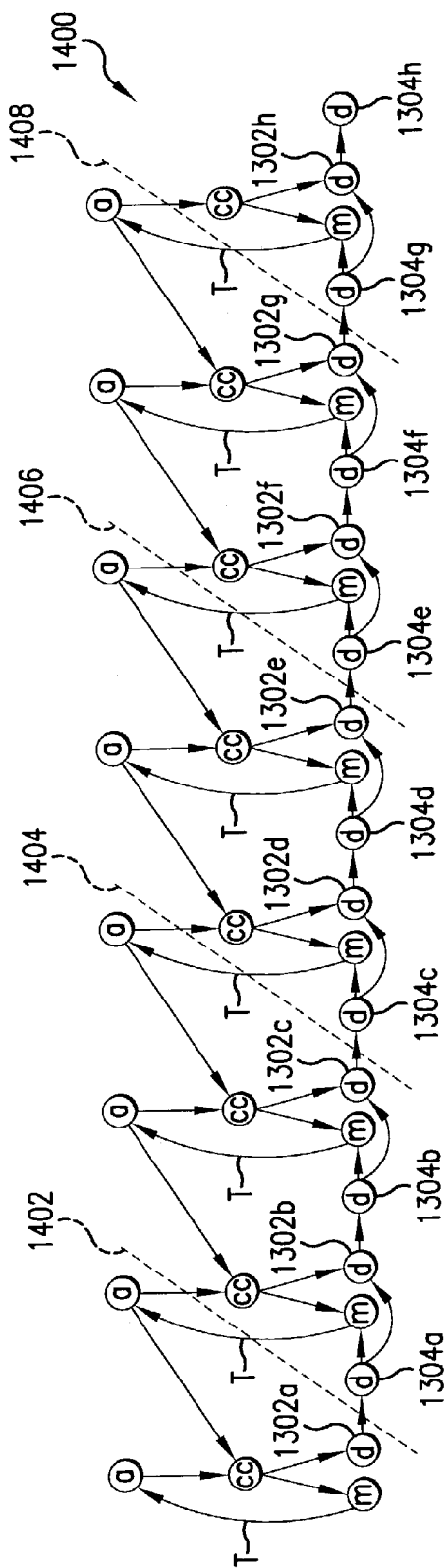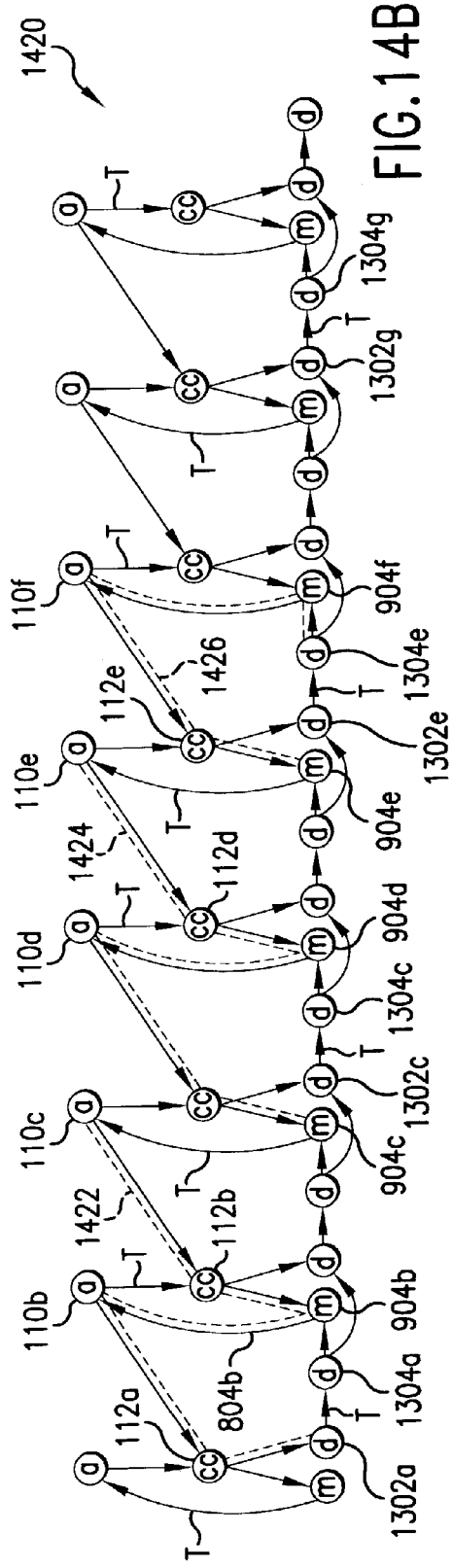

PIPELINED ADD-COMPARE-SELECT CIRCUITS AND METHODS, AND APPLICATIONS THEREOF

FIELD OF THE INVENTION

The present invention relates to digital communications. More particularly, the present invention relates to pipelined add-compare-select circuits and methods, and applications thereof.

BACKGROUND OF THE INVENTION

Communicating information via the internet and other digital communications systems has become common in the United States and elsewhere. As the number of people using these communications systems has increased so has the need for transmitting digital data at ever increasing rates.

As will be understood by persons skilled in the relevant arts, digital communications systems are designed, for example, using conventional pipelining, look-ahead, and parallelism techniques. These conventional design techniques have enabled engineers to build digital communications systems, using available manufacturing technologies, which operate at data rates in excess of 1 Gb/s. Applying these conventional techniques to the design of high-speed digital circuits, however, is difficult particularly when dealing with feedback and/or recursive operations. Furthermore, many of these conventional techniques will not improve the performance of the digital circuit to which they are applied, and some of these conventional techniques can even degrade circuit performance.

There is a current need for new design techniques and digital logic circuits that can be used to build high-speed digital communications systems. In particular, design techniques and digital logic circuits are needed that improve the throughput of add-compare-select circuits used in digital communications systems.

BRIEF SUMMARY OF THE INVENTION

Digital communications devices having high-speed add-compare-select circuits, and methods for designing the same are provided. The add-compare-select circuits include logic segments separated by delay devices. The separation of the logic segments allows for pipelining of the add-compare-select processes and advantageous circuit retiming. The pipelining and advantageous circuit retiming permit the digital communications devices to be clocked at higher rates than similar digital communications devices having conventional add-compare-select circuits.

In an embodiment, an add-compare-select (ACS) circuit is provided. The ACS circuit includes an adder, two code converters, a maximum or minimum select circuit, two decision logic circuits, and a delay circuit. The adder has an input port, a sum output port, and a carry output port. A first one of the code converters has an input port and an output port. The input port of this code converter is coupled to the sum output port of the adder. The second code converter also has an input port and an output port. The input port of this code converter is coupled to the carry output port of the adder. The maximum or minimum select circuit has a first input port, a second input port, and an output port. The first input port is coupled to the output port of the first code converter. The output is coupled to the input port of the adder. A first one of the decision logic circuits has an input port and an output port. The input port is coupled to the output port of the second code converter. The delay circuit has an input port and an output port. The input port is coupled to the output port of the first decision logic circuit. The second decision logic circuit has an input port and an output port. The input port is coupled to the output port of the delay device. The output port is coupled to the second input port of the maximum or minimum select circuit.

In an embodiment, a method for designing an add-compare-select circuit is provided. A number of bits (B) to be compared is selected. An initial most-significant bit first add-compare-select circuit capable of operating on B-bits is formed. A critical path in the initial most-significant-bit-first add-compare-select circuit is identified. The processing time of this critical path is designated as T. A sub-circuit of the initial most-significant-bit-first add-compare-select circuit is divided into a first sub-circuit segment and a second sub-circuit segment. This divided sub-circuit forms part of the identified critical path. A delay circuit is added between the first sub-circuit segment and the second sub-circuit segment to form a modified most-significant bit first add-compare-select circuit. A clocking circuit is formed to clock the modified most-significant bit first add-compare-select circuit. The clocking circuit formed has a clock period less than T.

Further features and advantages of the present invention, as well as the structure and operation of various embodiments of the present invention, are described in detail below.

BRIEF DESCRIPTION OF THE DRAWINGS/FIGURES

The present invention is described with reference to the accompanying figures. In the figures, like reference numbers indicate identical or functionally similar elements. Additionally, the leftmost digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

FIG. 14A is a circuit diagram illustrating the use of segmented decision logic circuits.

FIG. 14B is a circuit diagram illustrating how to retime the circuit of FIG. 14A.

DETAILED DESCRIPTION OF THE INVENTION

The present invention presents add-compare-select circuits and methods, and applications thereof. Add-compare-select circuits and methods are used to implement digital communications systems such as, for example, digital communications systems employing convolutional encoding with Viterbi decoding. Convolutional encoding with Viterbi decoding is a forward error correction technique that improves the capacity of a digital communications channel. Viterbi decoding can be viewed as a process for identifying a most likely transition path through a trellis diagram representing possible state transitions in a digital communications system.

Figure 1A:
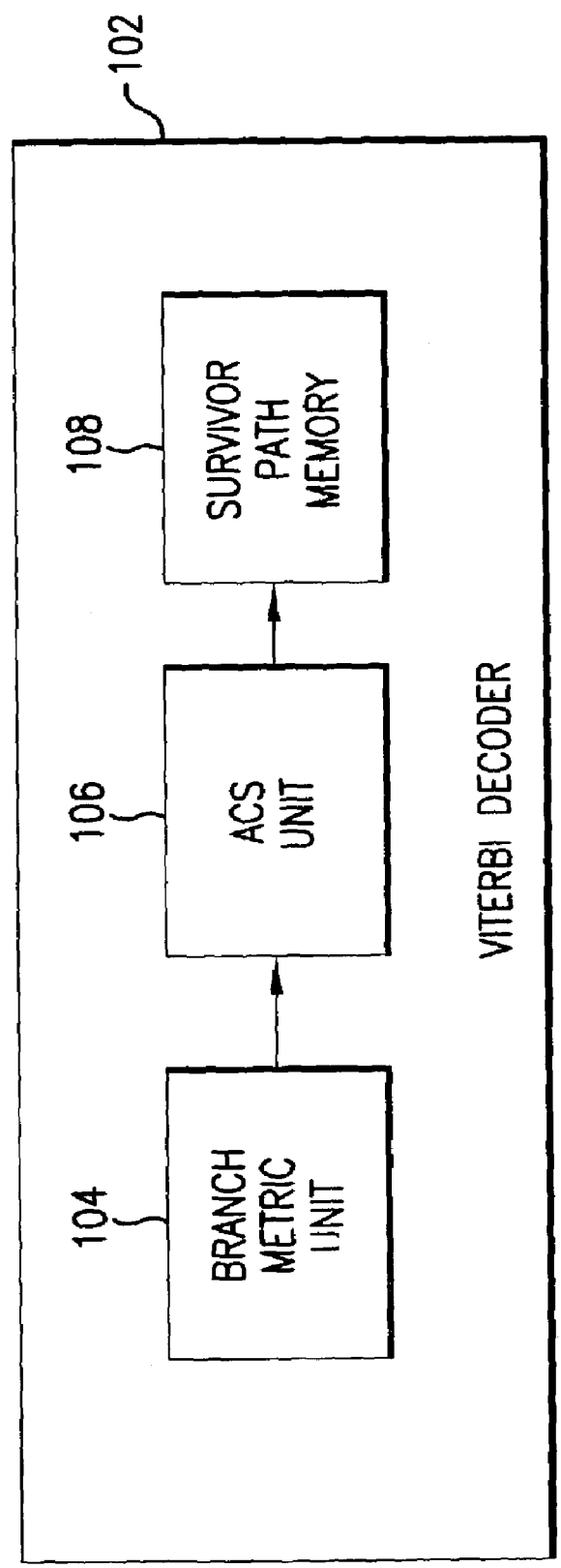
FIG. 1A is a block diagram of a Viterbi decoder.

FIG. 1A illustrates an example Viterbi decoder 102 that can be implemented using the add-compare-select circuits and methods of the present invention. Viterbi decoder 102 includes a branch metric unit 104, an add-compare-select (ACS) unit 106, and a survivor path memory 108. Viterbi decoder 102 implements the Viterbi algorithm to decode digital data sequences that have been encoded using a convolutional encoder (not shown).

The branch metric unit 104 computes minimum or maximum branch metrics, $\lambda_{ij}$, for a trellis diagram. As described herein, these branch metrics represent the difference between a received symbol and one or more symbols responsible for a state transition in the trellis diagram. Once computed, the branch metrics, $\lambda_{ij}$, are passed to the ACS unit 106.

The ACS unit 106 computes state metrics, $\gamma_j$. This computation is performed using the branch metrics, $\lambda_{ij}$, computed by branch metric unit 104. ACS unit 106 then compares the computed state metrics, $\gamma_j$, and selects maximum or minimum state metrics, $\gamma_j$, associated with survivor paths of the trellis diagram. Survivor paths represent the paths in the trellis diagram that have the best metric (e.g., maximum or minimum state metric) at a point in time under consideration.

The survivor path memory 108 stores the survivor paths selected by ACS unit 106. A final determination of the best path is made from the stored survivor paths residing in the survivor path memory 108.

Figure 1B:
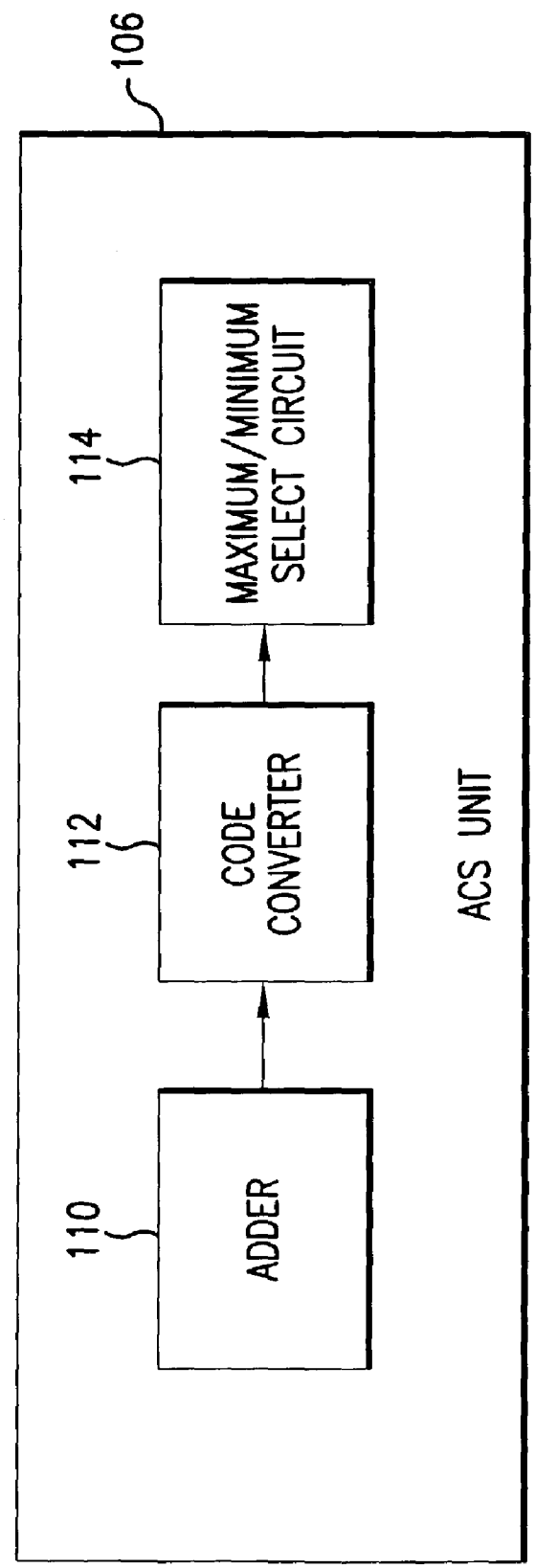
FIG. 1B is a block diagram of an add-compare-select circuit.

FIG. 1B further illustrates the ACS unit 106 shown in FIG. 1A. As illustrated in FIG. 1B, the ACS unit 106 includes an adder 110, a code converter 112, and a maximum/minimum select circuit 114. The adder 10 is used to add state metrics and branch metrics to form new state metrics. These new state metrics are provided to code converter 112. The code converter 112 re-codes the output of adder 110 (the new state metrics) and provides the re-coded output to the maximum/minimum select circuit 114. This re-coding performed by code converter 112 simplifies the logic needed to implement the maximum/minimum select circuit 114. In embodiments, the maximum/minimum select circuit 114 compares and selects either a maximum state metric or a minimum state metric from a group of state metrics. Circuits according to the invention for implementing ACS unit 106 are described in detail below.

Figure 8:
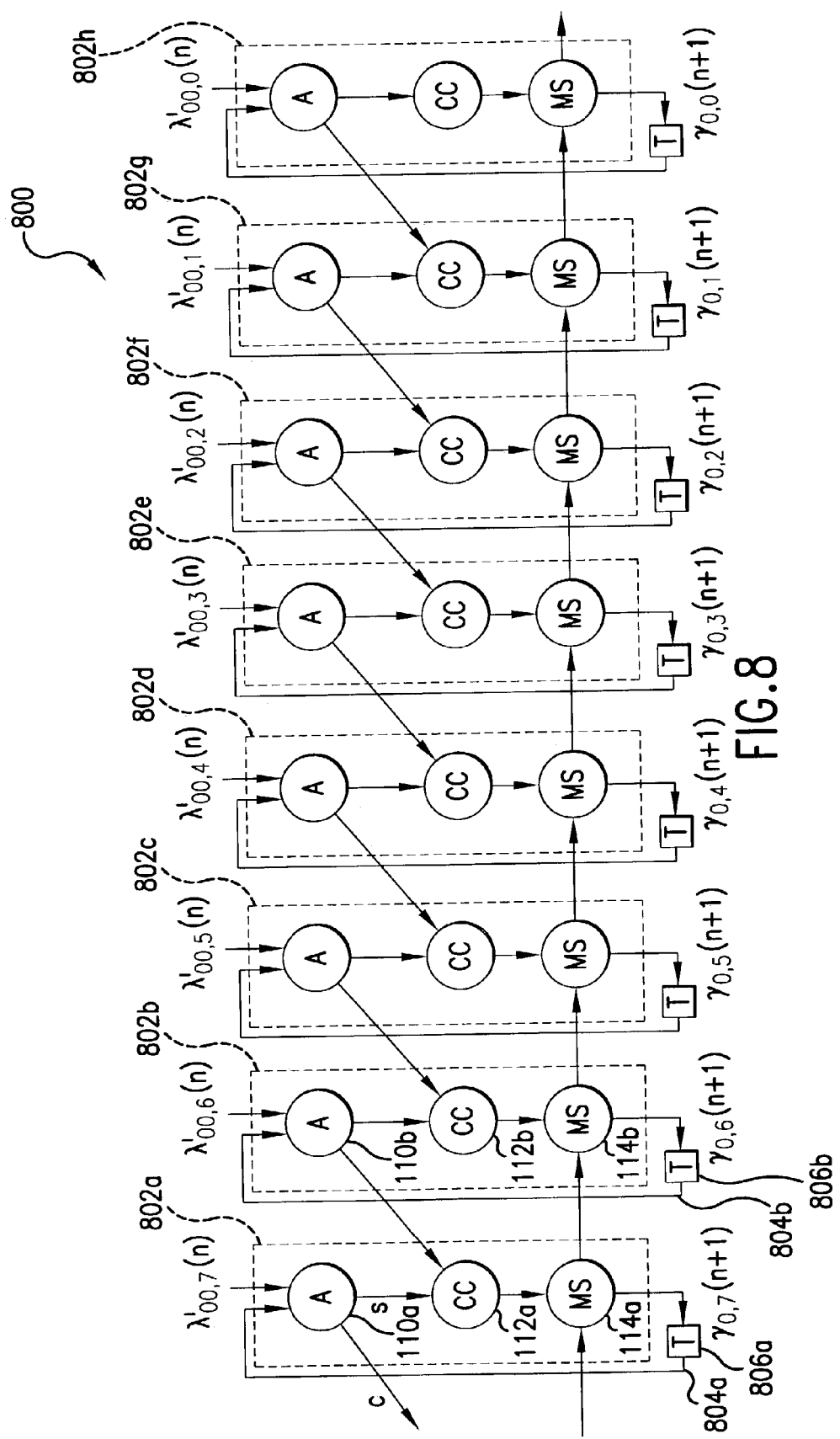
FIG. 8 is a circuit diagram of one bit-slice of a most-significant-bit first add-compare-select circuit.

While only one adder 110, one code converter 112, and one maximum/minimum select circuit 114 are shown in FIG. 1B, it will be apparent to persons skilled in the relevant arts given the description herein that more than one adder 110, more than one code converter 112, and more than one maximum/minimum select circuit 114 can be used to implement ACS unit 106 without departing from the scope of the present invention (see, e.g., FIG. 8).

Figure 2:
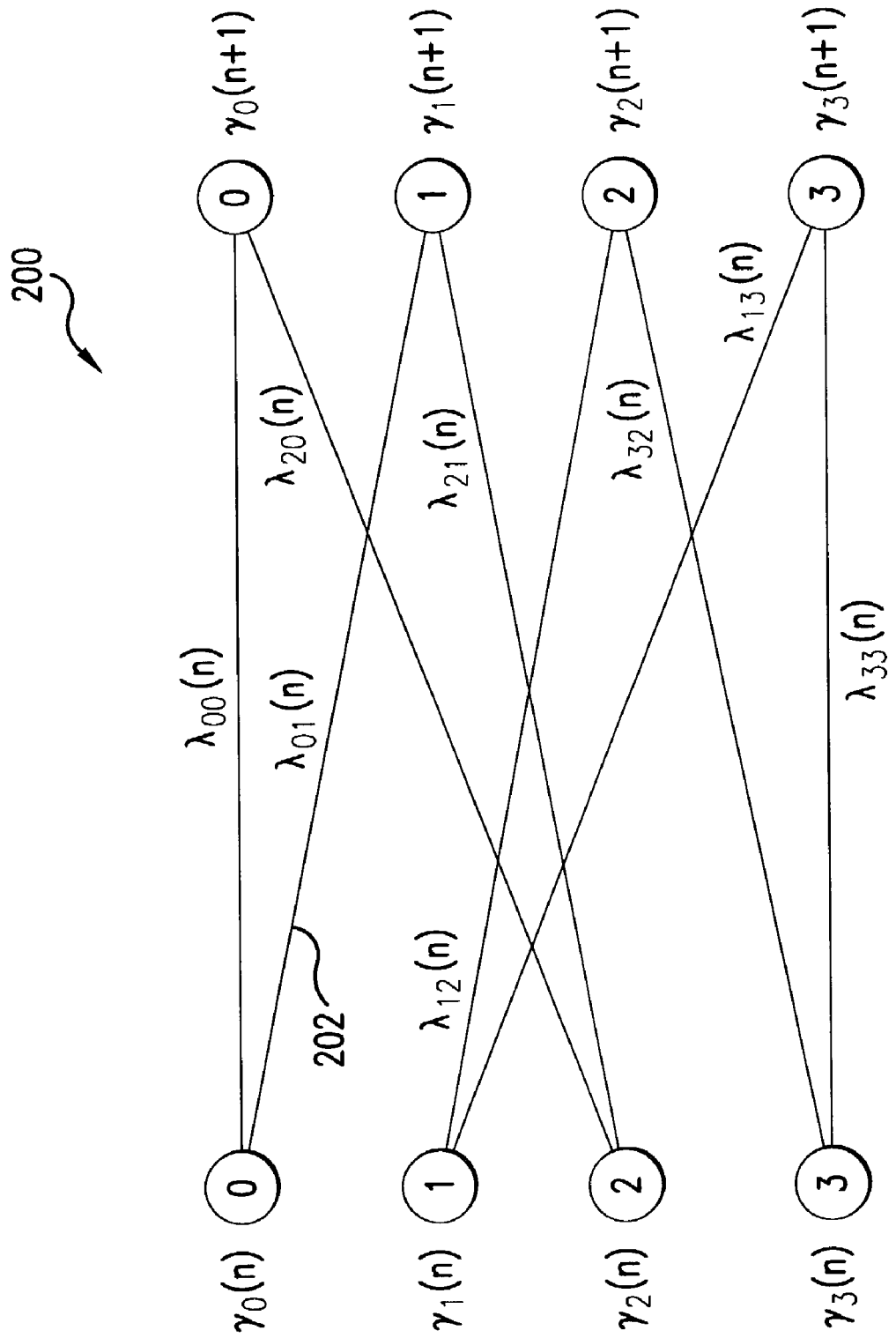
FIG. 2 is a trellis diagram for a 4-state Viterbi decoder.

FIG. 2 illustrates an example trellis diagram 200 for a four-state Viterbi decoder that can be implemented in accordance with the circuits and the methods of the present invention. The four states 0, 1, 2, and 3 at time index "n" are indicated along the left side of the trellis diagram 200. These four states each have an associated state metric (i.e., $\gamma_0(n)$, $\gamma_1(n)$, $\gamma_2(n)$, and $\gamma_3(n)$) that represents the accumulated metric along the shortest or longest path leading to the particular state. The four states 0, 1, 2, and 3 at time index "n+1" are indicated on the right side of the trellis diagram 200.

As would be known to persons skilled in the relevant arts, the Viterbi algorithm implemented by a Viterbi decoder can be used to correct data transmission errors in a digital communication system. The Viterbi algorithm involves, for example, determining the most likely path taken to reach a particular state of a given trellis diagram such as trellis diagram 200. In embodiments, this is achieved by calculating all possible metrics for a particular state of the trellis diagram and selecting the path associated with either the maximum metric or the minimum metric as the most likely path taken to reach the particular state.

The branch metrics $\lambda_{ij}(n)$ for the trellis diagram 200 are indicated along each path leading from one state at time index "n" to another state at time index "n+1". The branch metric $\lambda_{01}(n)$, for example, represents the metric associated with a transition from state 0 to state 1 along branch 202. The metric associated with the state 0, for a transition along branch 202, is equal to the sum of the metric associated with state 0 (i.e., $\gamma_0(n)$) and the metric $\lambda_{01}(n)$. As illustrated in FIG. 2, a state at time index "n+1" can be reached from more than one state at time index "n". For example, the state 0 can be reached from 0 or from 1. The metric for states 0, 1, 2, and 3 of trellis diagram 200 at time index "n+1" are given by $\gamma_0(n+1)$, $\gamma_1(n+1)$, $\gamma_2(n+1)$, and $\gamma_3(n+1)$, respectively.

In an embodiment, the state metrics $\gamma_0(n+1)$, $\gamma_1(n+1)$, $\gamma_2(n+1)$, and $\gamma_3(n+1)$ represent maximum metrics. The maximum metric for each state of trellis diagram 200 at time index "n+1" can be calculated using EQs. 1–4 below.

$$\gamma_0(n+1)=\max[\gamma_0(n)+\lambda_{00}(n),\gamma_2(n)+\lambda_{20}(n)] \quad \text{EQ. 1}$$

$$\gamma_2(n+1)=\max[\gamma_1(n)+\lambda_{12}(n),\gamma_3(n)+\lambda_{32}(n)] \quad \text{EQ. 2}$$

$$\gamma_1(n+1)=\max[\gamma_0(n)+\lambda_{01}(n),\gamma_2(n)+\lambda_{21}(n)] \quad \text{EQ. 3}$$

$$\gamma_3(n+1)=\max[\gamma_1(n)+\lambda_{13}(n),\gamma_3(n)+\lambda_{33}(n)] \quad \text{EQ. 4}$$

Where it is desired to identify the minimum metric for each state, the minimum (min) function can be used in place of the maximum (max) function in EQs. 1–4.

As would be known to persons skilled in the relevant arts, the operation of a Viterbi decoder is often limited by speed bottlenecks found in add-compare-select circuits. These speed bottlenecks are created, for example, as a result of applying conventional design techniques to the recursive nature of add-compare-select operations. One technique that can be used to accelerate the operating speed of a Viterbi decoder is to use an N-step look-ahead network, where N is an integer greater than 0, to provide inputs to parallel processing pipelines. An advantage of using an N-step look-ahead network is that it will result in a fully connected trellis diagram such as the one illustrated in FIG. 3.

Figure 3:
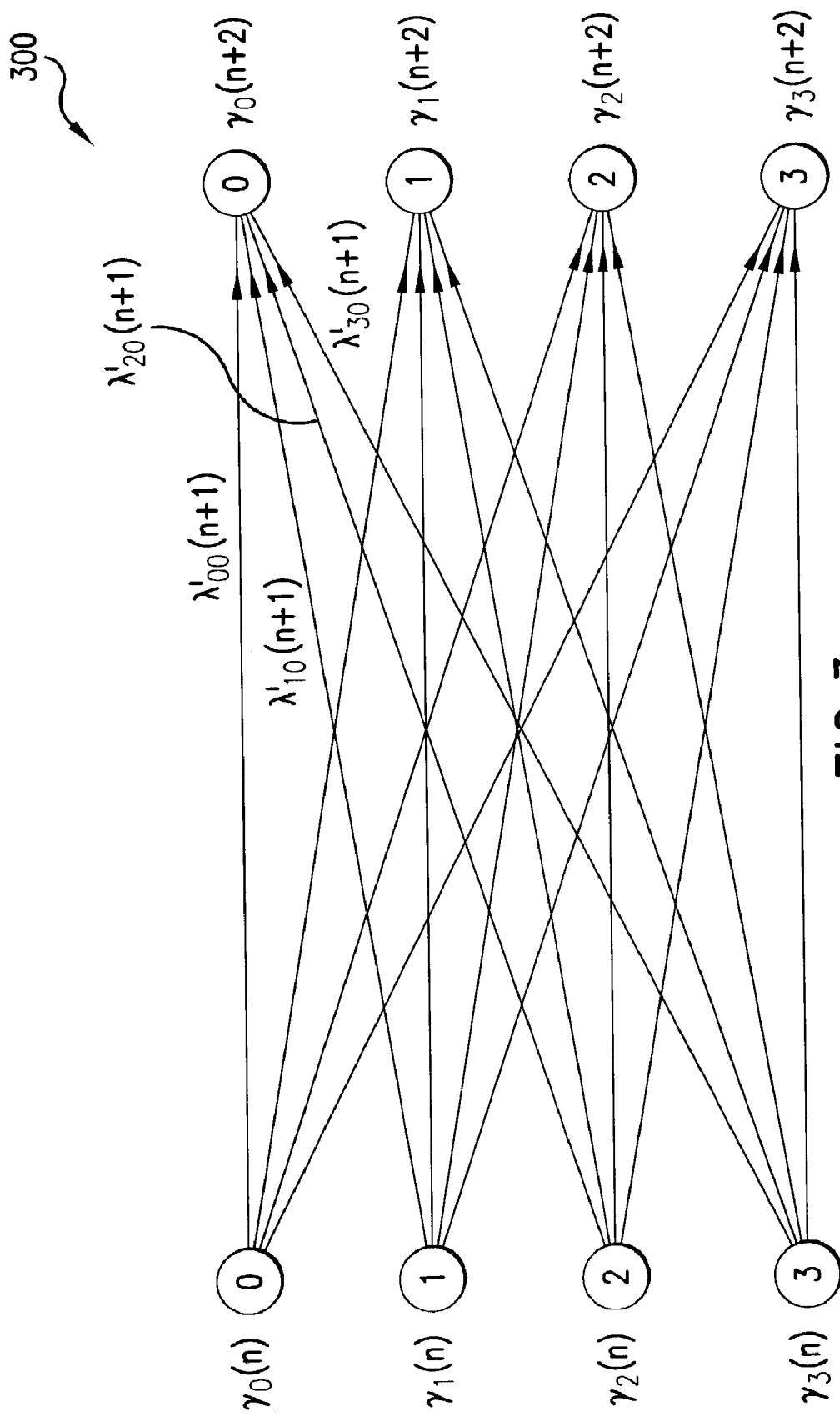
FIG. 3 is a trellis diagram for a 4-state Viterbi decoder using 2-step look-ahead.

FIG. 3 illustrates a four-state trellis diagram 300 using 2-steps of look-ahead. EQ. 5 illustrates how to calculate the maximum path metric or state metric, $\gamma_0(n+2)$, for state 2 at a time index "n+2".

$$\gamma_0(n+2) = \max[\gamma_0(n)+\lambda'_{00}(n+1), \gamma_1(n)+\lambda'_{10}(n+1), \gamma_2(n)+\lambda'_{20}(n+1), \gamma_3(n)+\lambda'_{30}(n+1)] \quad \text{EQ. 5}$$

where $\lambda'_{ij}(n)$ is the combined branch metric of the path i-j. The path metric, $\gamma_j(n+2)$, for the state "j" of trellis diagram 300 is given by EQ. 6.

$$\gamma_j(n+2) = \max_j[\gamma_i(n)+\lambda'_{ij}(n)] \; \forall \; i, j=0, 1, 2, 3 \quad \text{EQ. 6}$$

Where it is desired to identify the minimum metric for each state, the minimum (min) function can be used in place of the maximum (max) function in EQ. 6.

Figure 4:
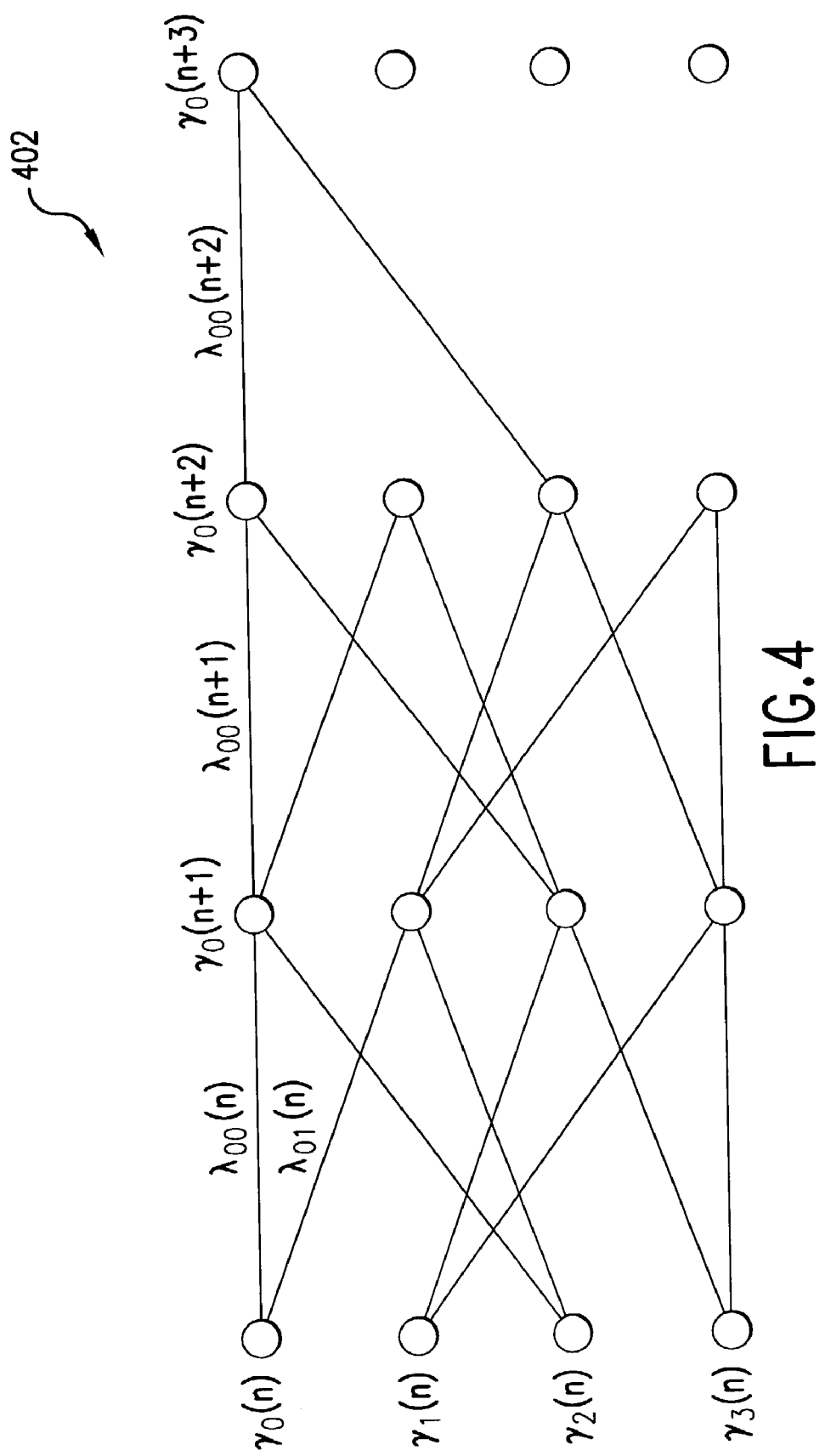
FIG. 4 is a trellis diagram for three time-steps of a 4-state Viterbi decoder.

FIG. 4 illustrates state transitions for three time-steps of a trellis diagram 402 for a four-state Viterbi decoder. Trellis diagram 402 can be used, for example, to form the trellis diagram 300 illustrated in FIG. 3. As described herein, the minimum metric for the states 0, 1, 2, and 3 at time index "n+3" can be found using EQ. 7 below. The computations for the state metrics $\gamma_0(n+2)$, $\gamma_1(n+2)$, $\gamma_2(n+2)$, and $\gamma_3(n+2)$ are given by EQs. 8–11 below. The state metric for the state $\gamma_0(n+3)$ is given by EQ. 12 below.

$$\gamma_j(n+3) = \max_j[\gamma_i(n)+\lambda'_{ij}(n)] \; \forall \; i, j=0, 1, 2, 3 \quad \text{EQ. 7}$$

$$\gamma_0(n+2) = \min\begin{bmatrix} \gamma_0(n)+\{\lambda_{00}(n)+\lambda_{00}(n+1)\}, \gamma_1(n)+\{\lambda_{12}(n)+\lambda_{20}(n+1)\}, \\ \gamma_2(n)+\{\lambda_{20}(n)+\lambda_{00}(n+1)\}, \gamma_3(n)+\{\lambda_{32}(n)+\lambda_{20}(n+1)\} \end{bmatrix} \quad \text{EQ. 8}$$

$$\gamma_1(n+2) = \min\begin{bmatrix} \gamma_0(n)+\{\lambda_{00}(n)+\lambda_{01}(n+1)\}, \gamma_1(n)+\{\lambda_{12}(n)+\lambda_{21}(n+1)\}, \\ \gamma_2(n)+\{\lambda_{20}(n)+\lambda_{01}(n+1)\}, \gamma_3(n)+\{\lambda_{32}(n)+\lambda_{21}(n+1)\} \end{bmatrix} \quad \text{EQ. 9}$$

$$\gamma_2(n+2) = \min\begin{bmatrix} \gamma_0(n)+\{\lambda_{01}(n)+\lambda_{12}(n+1)\}, \gamma_1(n)+\{\lambda_{13}(n)+\lambda_{32}(n+1)\}, \\ \gamma_2(n)+\{\lambda_{21}(n)+\lambda_{12}(n+1)\}, \gamma_3(n)+\{\lambda_{33}(n)+\lambda_{32}(n+1)\} \end{bmatrix} \quad \text{EQ. 10}$$

$$\gamma_3(n+2) = \min\begin{bmatrix} \gamma_0(n)+\{\lambda_{01}(n)+\lambda_{13}(n+1)\}, \gamma_1(n)+\{\gamma_{13}(n)+\lambda_{33}(n+1)\}, \\ \gamma_2(n)+\{\lambda_{21}(n)+\lambda_{13}(n+1)\}, \gamma_3(n)+\{\gamma_{33}(n)+\lambda_{33}(n+1)\} \end{bmatrix} \quad \text{EQ. 11}$$

$$\gamma_0(n+3) = \min\begin{bmatrix} \gamma_0(n)+\min\left\{\begin{array}{l}\lambda_{00}(n)+\lambda_{00}(n+1)+\lambda_{00}(n+2),\\ \lambda_{01}(n)+\lambda_{12}(n+1)+\lambda_{20}(n+2)\end{array}\right\} \\ \gamma_1(n)+\min\left\{\begin{array}{l}\lambda_{12}(n)+\lambda_{20}(n+1)+\lambda_{00}(n+2),\\ \lambda_{13}(n)+\lambda_{32}(n+1)+\lambda_{20}(n+2)\end{array}\right\} \\ \gamma_2(n)+\min\left\{\begin{array}{l}\lambda_{20}(n)+\lambda_{00}(n+1)+\lambda_{00}(n+2),\\ \lambda_{21}(n)+\lambda_{12}(n+1)+\lambda_{20}(n+2)\end{array}\right\} \\ \gamma_3(n)+\min\left\{\begin{array}{l}\lambda_{32}(n)+\lambda_{20}(n+1)+\lambda_{00}(n+2),\\ \lambda_{33}(n)+\lambda_{32}(n+1)+\lambda_{20}(n+2)\end{array}\right\} \end{bmatrix}$$

Figure 5:
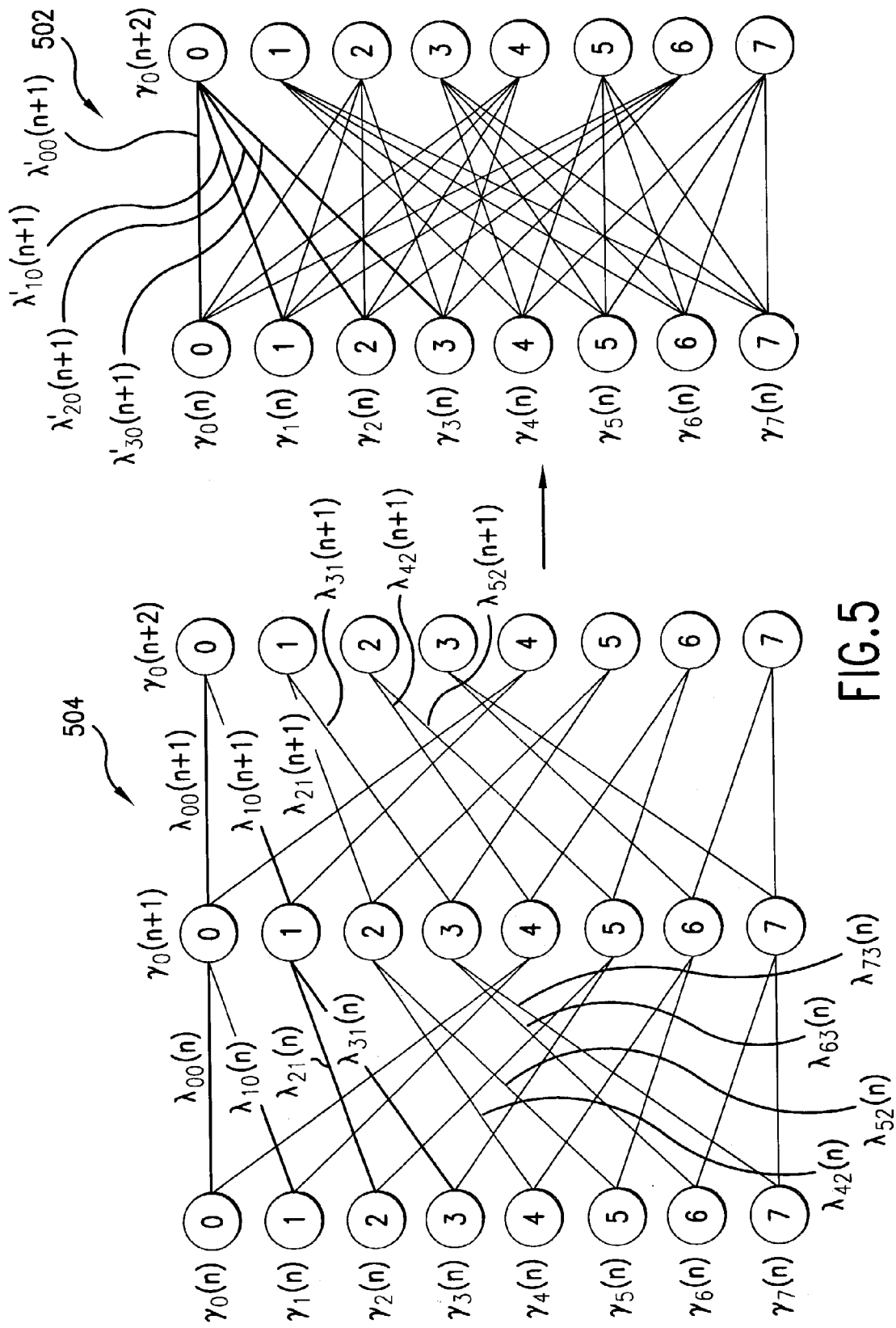
FIG. 5 is a trellis diagram for an 8-state Viterbi decoder using 2-step look-ahead.
Figure 6:
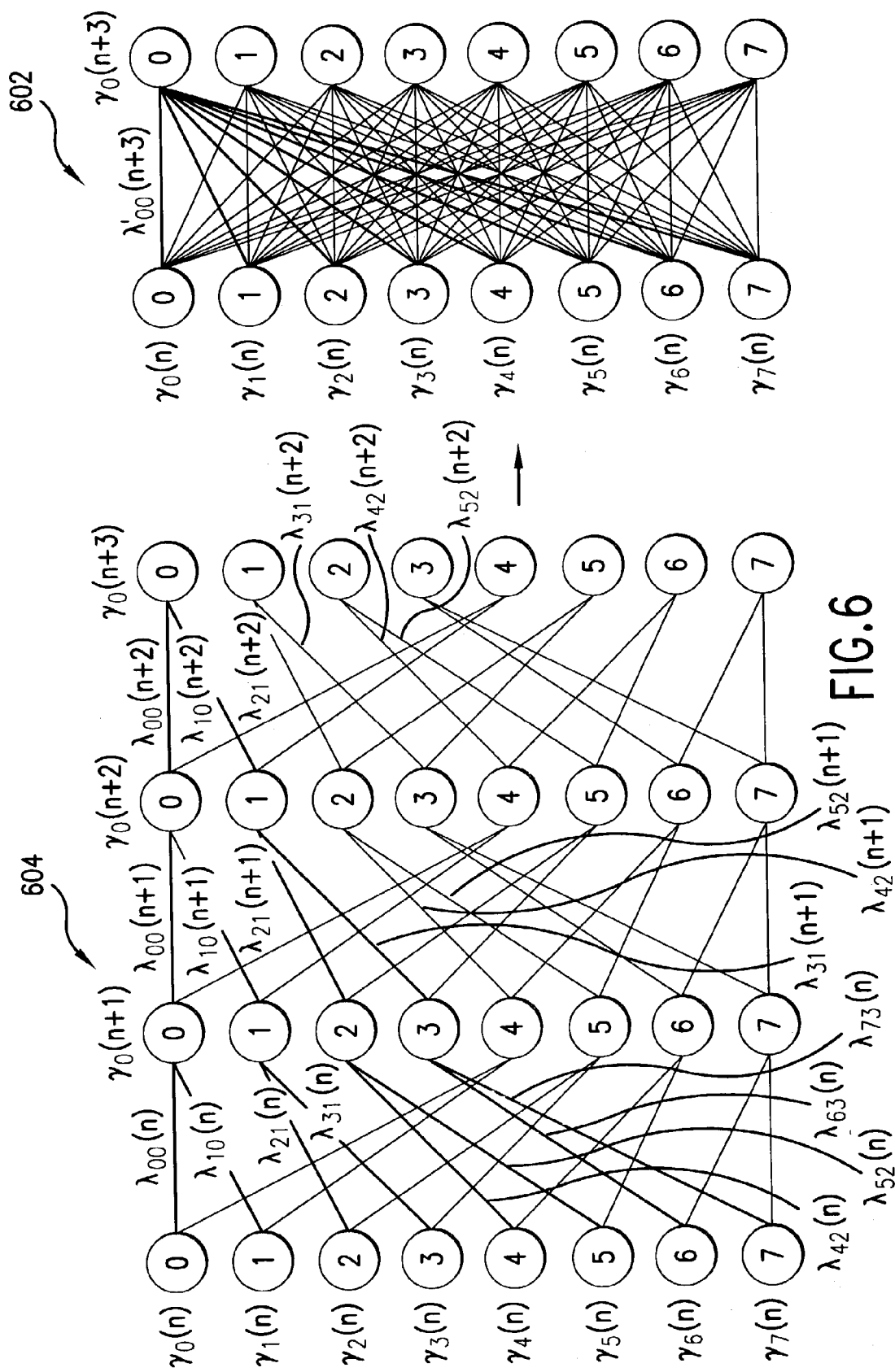
FIG. 6 is a trellis diagram for an 8-state Viterbi decoder using 3-step look-ahead.
Figure 7:
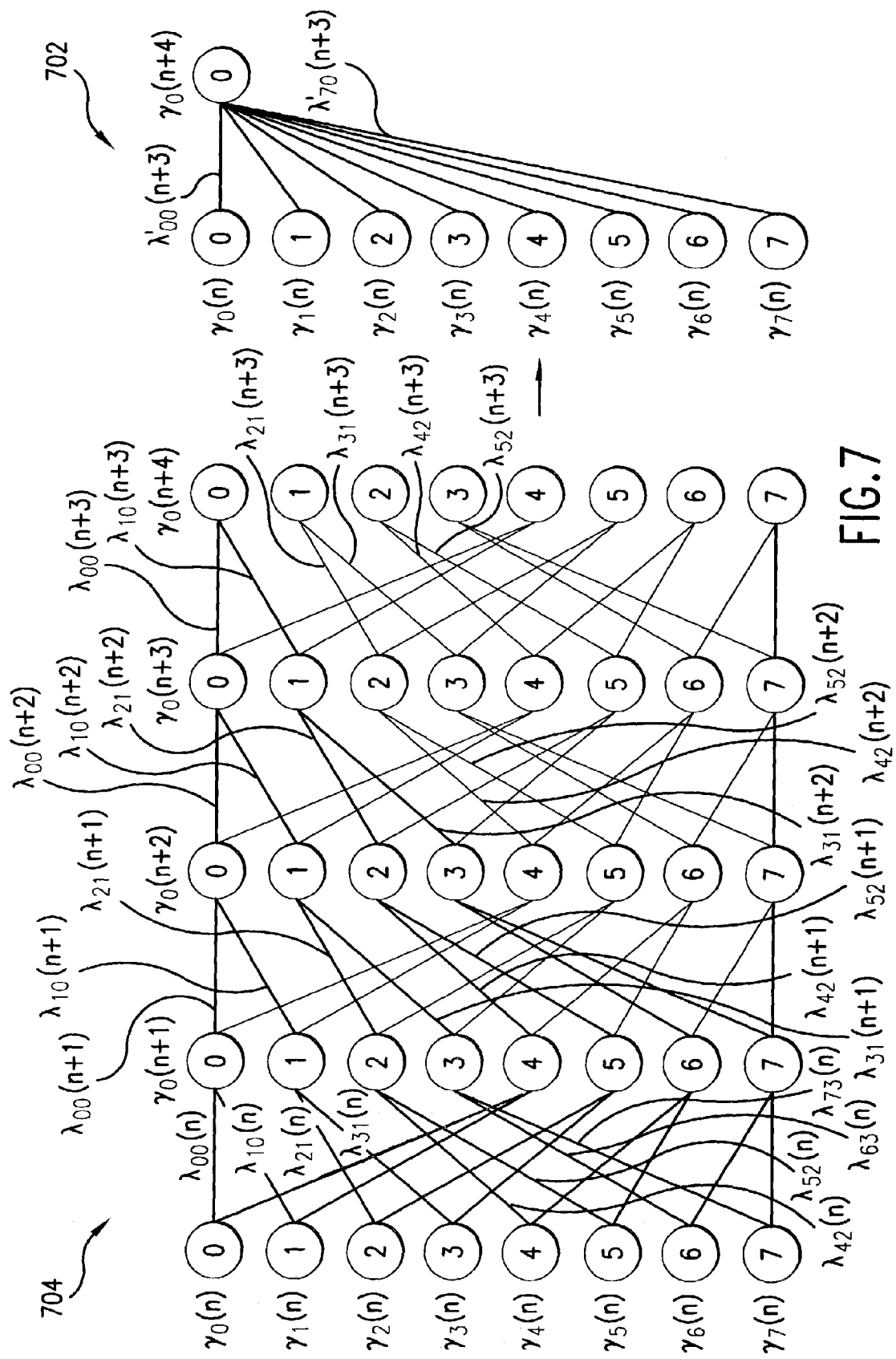
FIG. 7 is a trellis diagram for an 8-state Viterbi decoder using 4-step look-ahead.

The four-state trellis diagrams of FIG. 3 and FIG. 4 are provided for example only and not limitation. Based on the teachings described herein, persons skilled in the relevant arts will recognize that other multi-state N-step look-ahead configurations can be formed and implemented in accordance with the present invention. For example, FIG. 5 illustrates an 8-state trellis diagram 502, using 2-steps of look-ahead, formed from a trellis diagram 504. FIG. 6 illustrates an 8-state trellis diagram 602, using 3-steps of look-ahead, formed from a trellis diagram 604. FIG. 7 illustrates a partial 8-state trellis diagram 702, using 4-steps of look-ahead, formed from a trellis diagram 704.

FIG. 8 illustrates a section of an example most-significant-bit (MSB) first ACS unit 800. ACS unit 800 is used for processing 8-bit words. ACS unit 800 performs bit-wise operations. ACS unit 800 shows only one bit-slice out of N-slices, where N is the number of states in the Viterbi decoder.

As shown in FIG. 8, ACS unit 800 is formed from eight ACS circuits 802a–h. Each ACS circuit 802 includes an adder 110, a code converter 112, and a maximum/minimum select (MS) circuit 114. For each ACS circuit 802, a feedback loop 804 couples a state metric output, $\gamma_{0,i}(n+1)$, of MS circuit 114 to an input of adder 110. A delay device 806 placed in each feedback path 804 delays the state metrics, $\gamma_{0,i}(n+1)$, from reaching the input of adder 110 for a period of time (T). The eight ACS circuits 802a–h are interconnected as shown in FIG. 8.

In some embodiments of the invention, each adder 110 is replaced by two adders. A first adder is used to perform the carry computation shown in FIG. 8. The second adder is used to perform the sum computation shown in FIG. 8.

ACS unit 800 contains a number of loops or paths. These loops or paths are illustrated in FIGS. 9A–C.

Figure 9A:
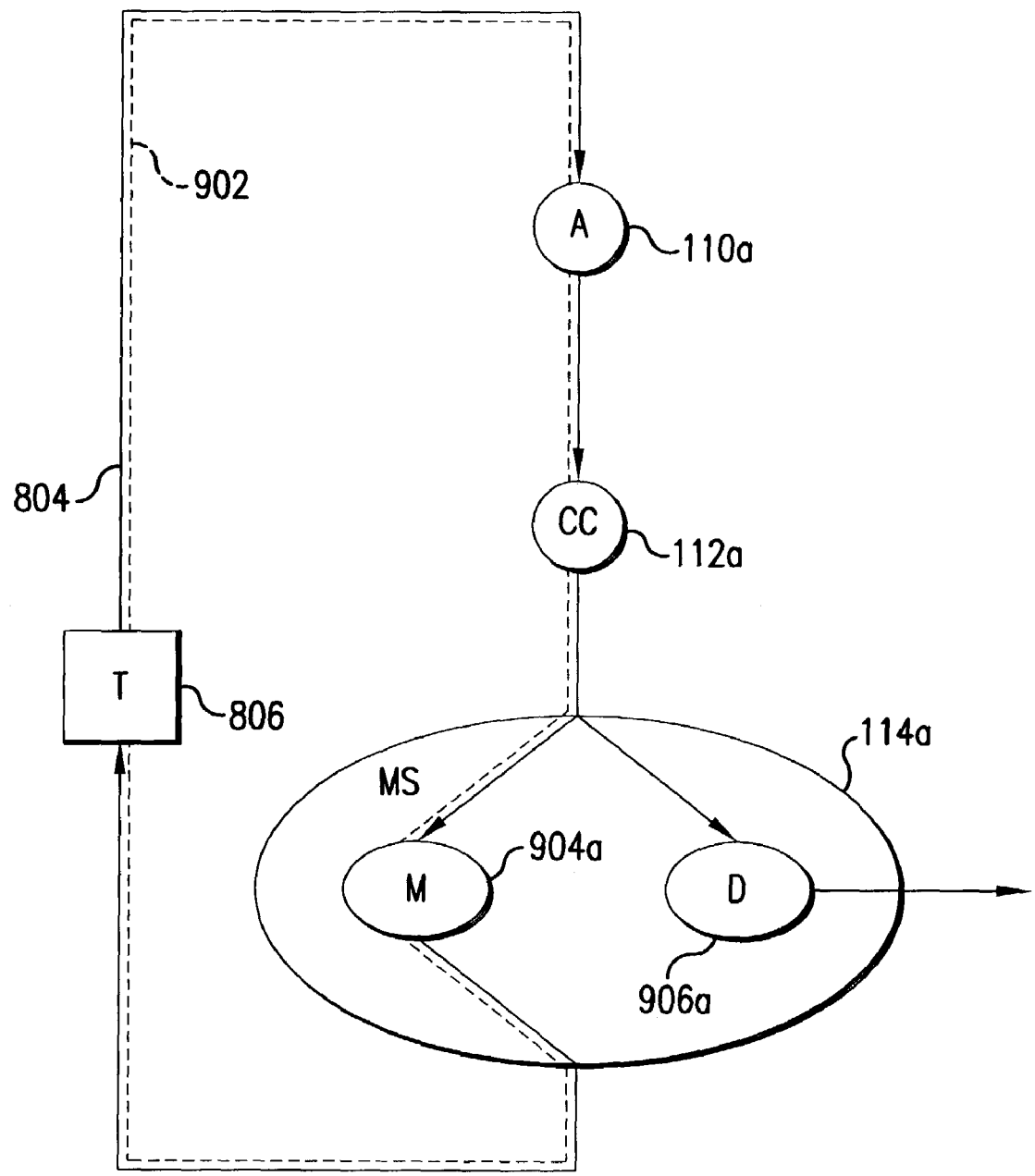
FIG. 9A is a circuit diagram for a feedback loop of the circuit of FIG. 8.

FIG. 9A illustrates a loop 902. Loop 902 includes adder 110a, code converter 112a, MS circuit 114a, feedback path 804a, and delay device 806a. As shown in FIG. 9A, in embodiments, MS circuit 114a comprises both a maximum/minimum select circuit (M) 904a and a decision logic circuit (D) 906a. The decision logic circuit 906a is not included in loop 902. Loop 902 is representative of other similar loops in ACS unit 800.

Figure 9B:
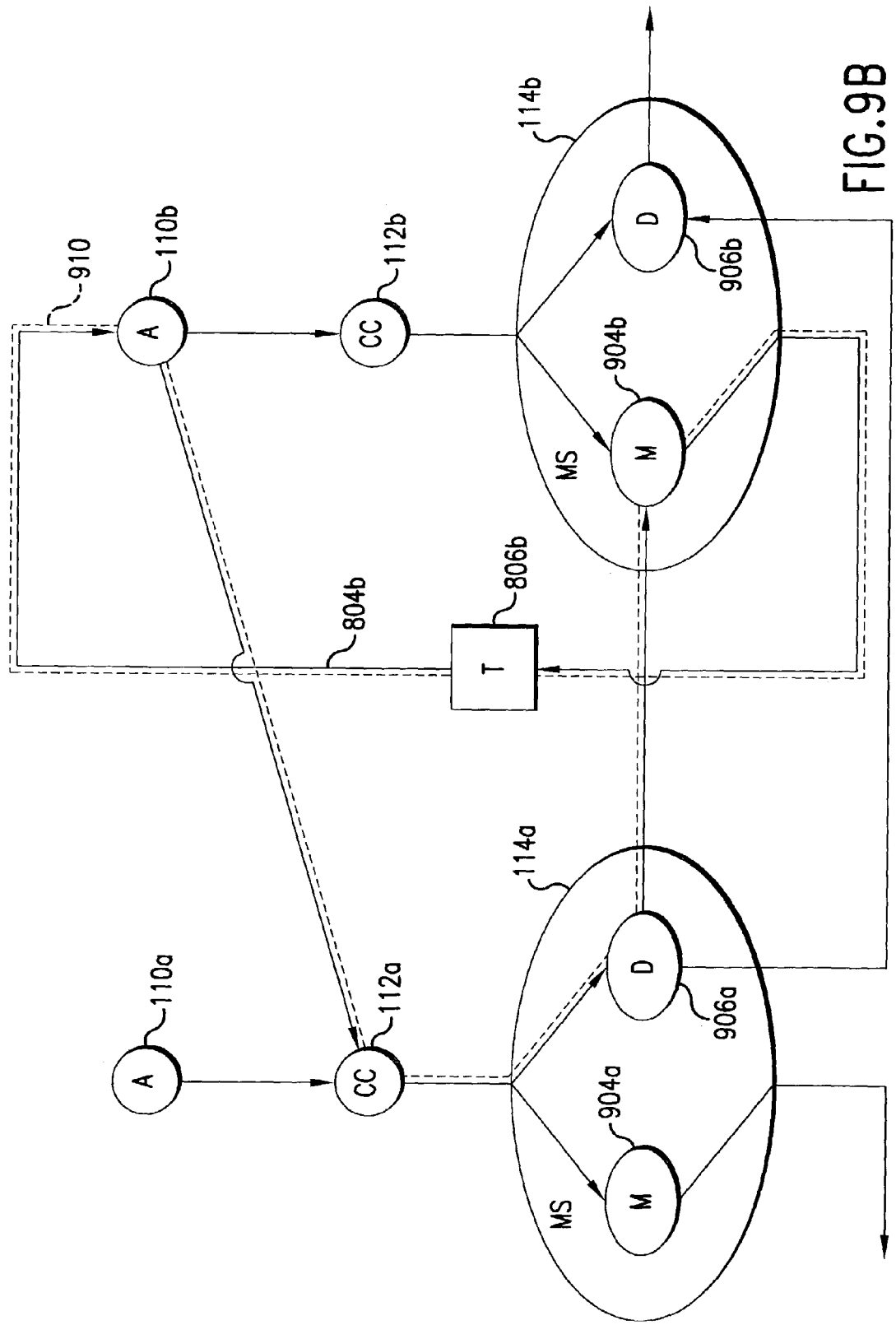
FIG. 9B is a circuit diagram for a feedback loop of the circuit of FIG. 8.

FIG. 9B illustrates a loop 910. Loop 910 includes adder 110b, code converter 112a, decision logic circuit 906a, maximum/minimum select circuit 904b, feedback path 804b, and delay device 806b. As can be seen by comparing loop 910 to loop 902, loop 910 includes more devices than loop 902. Thus, the settling time of loop 910 following a change in branch metric inputs, $\lambda_{00,j}(n)$, is longer than the settling time of loop 902. Loop 902 is representative of other similar loops in ACS unit 800.

Figure 9C:
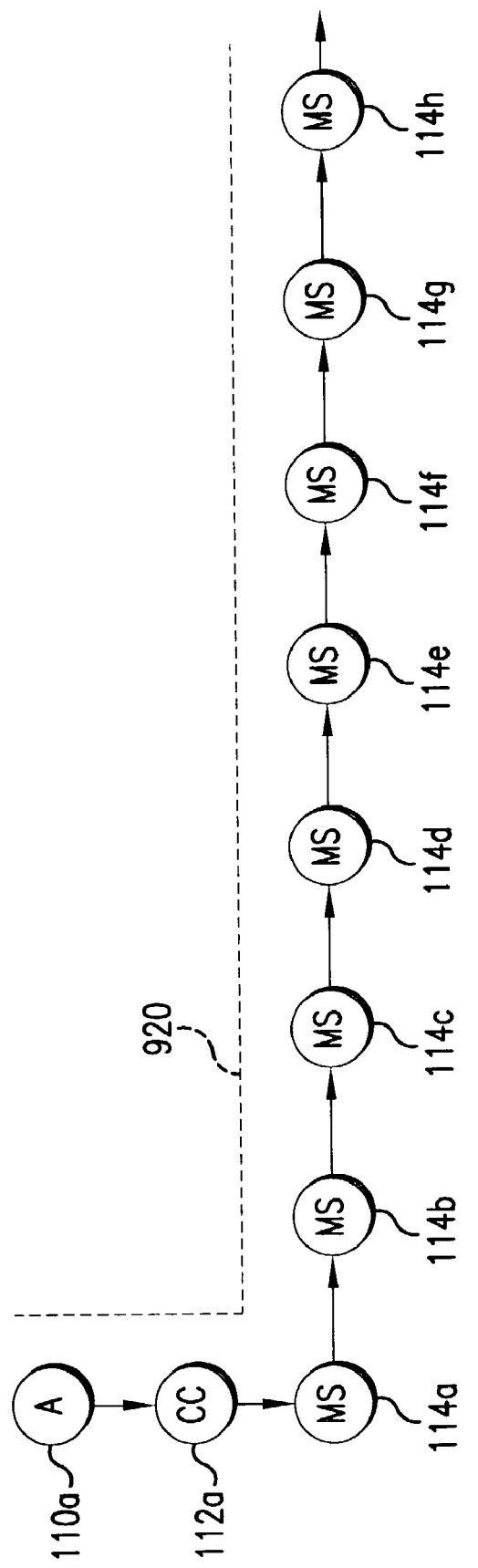
FIG. 9C is a circuit diagram for a critical path of the circuit of FIG. 8.

FIG. 9C illustrates a path 920 of ACS unit 800. Path 920 is a critical path for ACS unit 920 (i.e., path 920 has the longest path settling time or operating time of any path in ACS unit 800 following a change in inputs).

As shown in FIG. 9C, critical path 920 includes adder 110*a*, code converter 112*a*, and MS circuits 114*a–h*. As can be seen from FIG. 9C, the critical path 920 of ACS unit 800 will grow linearly with word-length if ACS unit 800 is used to process longer length words (e.g., word lengths of 16-bits, 32-bits, or 64-bits). ACS unit 800 can be retimed, however, to eliminate path 920 as the critical path of ACS unit 800.

Figure 10:
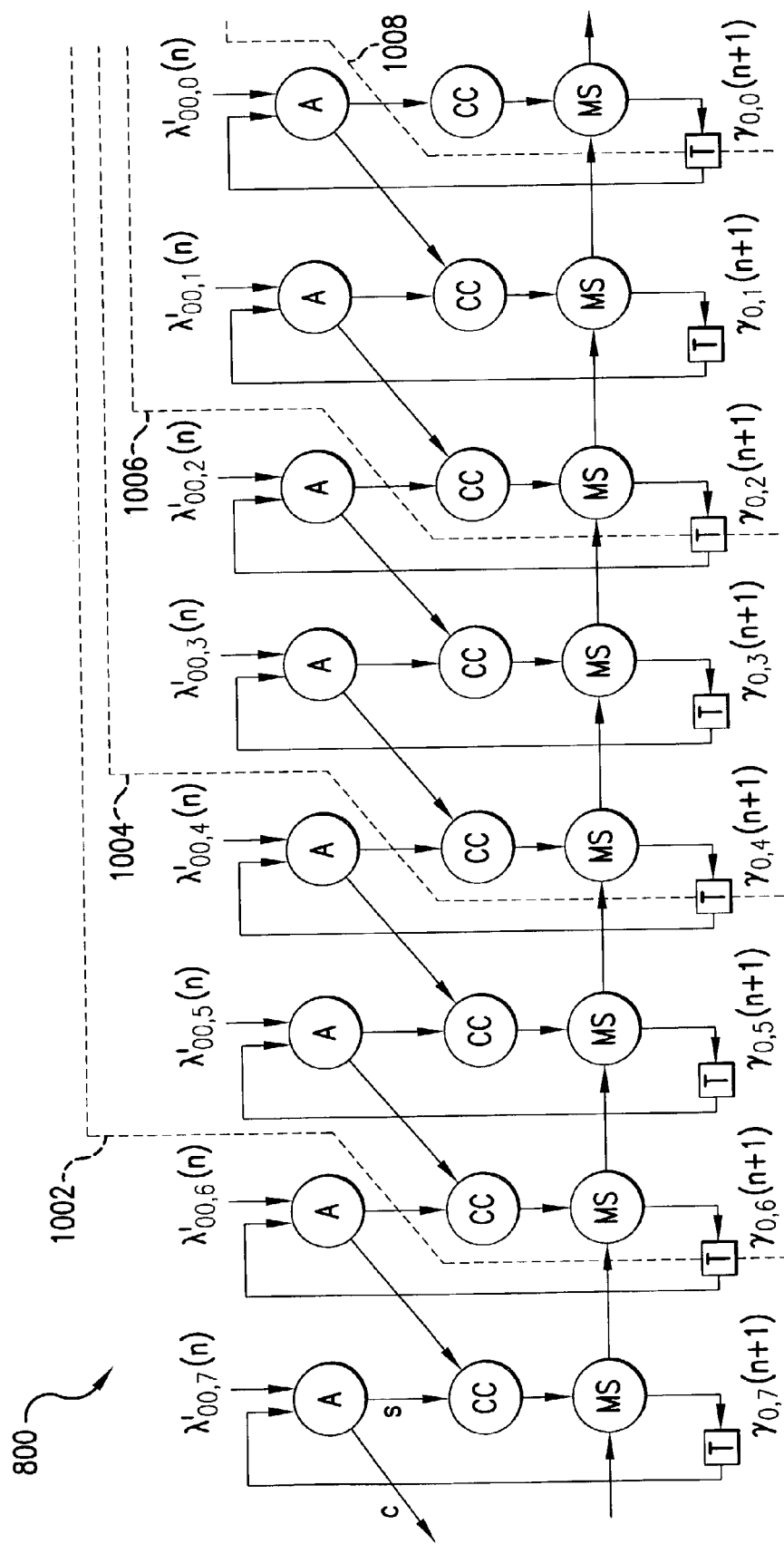
FIG. 10 is a circuit diagram illustrating cut-sets that can be used to retime the circuit of FIG. 8.

FIG. 10 illustrates four cut-sets 1002, 1004, 10006, and 1008 that can be used to retime ACS unit 800. The retiming of ACS unit 800 using the cut-sets 1002, 1004, 1006, and 1008 leads to the circuit 1100 shown in FIG. 11.

Figure 11:
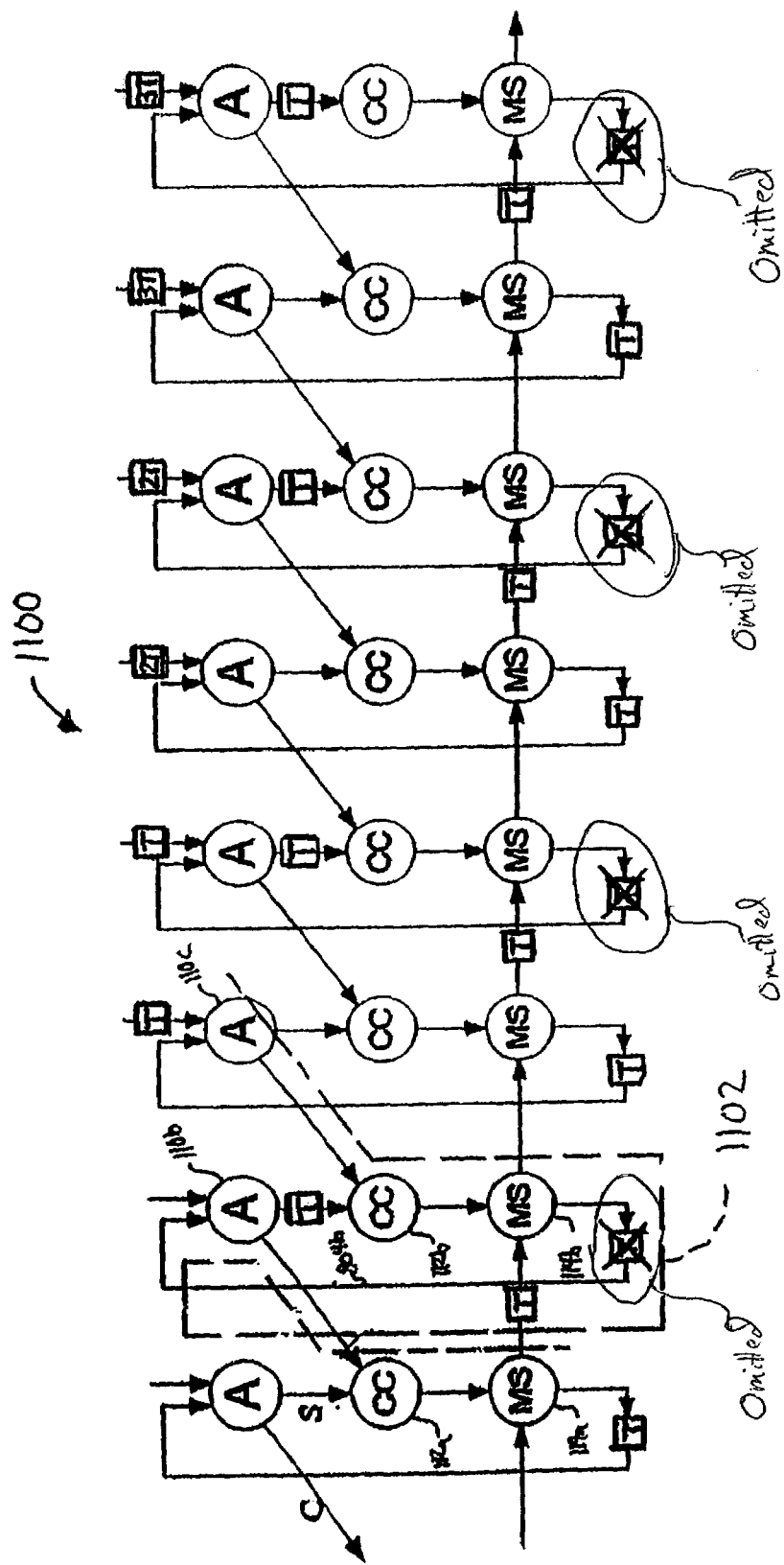
FIG. 11 is a circuit diagram illustrating the retimed circuit of FIG. 10.

FIG. 11 illustrates the retimed circuit 1100 formed from ACS unit 800. The critical path of circuit 1100 is path 1102. As shown in FIG. 11, path 1102 includes adders 110*b* and 110*c*, code converters 112*a* and 112*b*, MS circuits 114*a* and 114*b*, and feedback path 804*b*. The settling time of path 1102 is the settling time of two adders, two code converters, and two MS circuits. An advantage of the retimed circuit 1100 is that its critical path will not grow with word-length.

In a typical implementation, the computation time for an adder 110 is approximately 0.4 ns, the computation time for a code converter 112 is approximately 0.15 ns, and the computation time for an MS circuit 114 varies with the total number of states being implemented. For example, in a typical 8-state Viterbi decoder, the computation time for a MS circuit 114 is approximately 1.2 ns. A computation time of 1.2 ns is attributable to the decision logic circuit 906 and 0.8 ns is attributable to the maximum/minimum select circuit 904. The maximum time of these two computation times is the computation time of MS circuit 114. In a typical 4-state Viterbi decoder, the computation time for a MS circuit 114 is approximately 0.7 ns. This is because 0.7 ns is attributable to the decision logic circuit 906 and 0.4 ns is attributable to the maximum/minimum select circuit 904. The increased computation time of the MS circuit 114 in an 8-state Viterbi decoder is due to the extra logic needed to select among a larger number of states.

Using the typical computation times stated above, the settling time of the critical path 1102 in FIG. 11 (for an 8-state Viterbi decoder) is 3.1 ns. This time is the computation time of two adders 110 (0.4 ns+0.4 ns=0.8 ns), the computation time of two code converters 112 (0.15 ns +0.15 ns =0.3 ns), the computation time of one maximum/minimum select circuit 904 (0.8 ns), and the computation time of one decision logic circuit 906 (1.2 ns). This is greater than the loop bound of circuit 1100 (i.e., loop 910 shown in FIG. 9B), which is 2.55 ns (i.e., the computation time of one adder 110 (0.4 ns), the computation time of one code converter (0.15 ns), the computation time of one maximum/minimum select circuit 904 (0.8 ns), and the computation time of one decision logic circuit 906 (1.2 ns)). The loop bound of loop 910 is also the iteration bound of circuit 1100.

Using the typical computation times stated above for a 4-state Viterbi decoder, the settling time of the critical path 1102 is 2.2 ns. This time is the computation time of two adders 110 (0.4 ns+0.4 ns=0.8 ns), the computation time of two code converters 112 (0.15 ns+0.15 ns=0.3 ns), the computation time of one maximum/minimum select circuit 904 (0.4 ns), and the computation time of one decision logic circuit 906 (0.7 ns). This is greater than the loop bound of a 4-state Viterbi decoder circuit (i.e., loop 910 shown in FIG. 9B), which is 1.65 ns (i.e., the computation time of one adder 110 (0.4 ns), the computation time of one code converter (0.15 ns), the computation time of one maximum/minimum select circuit 904 (0.4 ns), and the computation time of one decision logic circuit 906 (0.7 ns)).

Table 1 below summarizes the iteration bound times and the critical path times of a typical 4-state Viterbi decoder and a typical 8-state Viterbi decoder implemented using the circuits and methods described above.

TABLE 1

|  | 4-State Viterbi Decoder | 8-State Viterbi Decoder |
| --- | --- | --- |
| Iteration Bound | 1.65 ns | 2.55 ns |
| Critical Path | 2.2 ns | 3.1 ns |

Using the circuits and methods of the invention described below, the critical path times shown in Table 1 can be further reduced. As described below, the present invention improves the retiming technique applied to ACS unit 800 to form circuit 1100 by pipelining the functions of the ACS unit. In this way, the ACS unit can be retimed to achieve a critical path time that is closer to the iteration bound.

Figure 12:
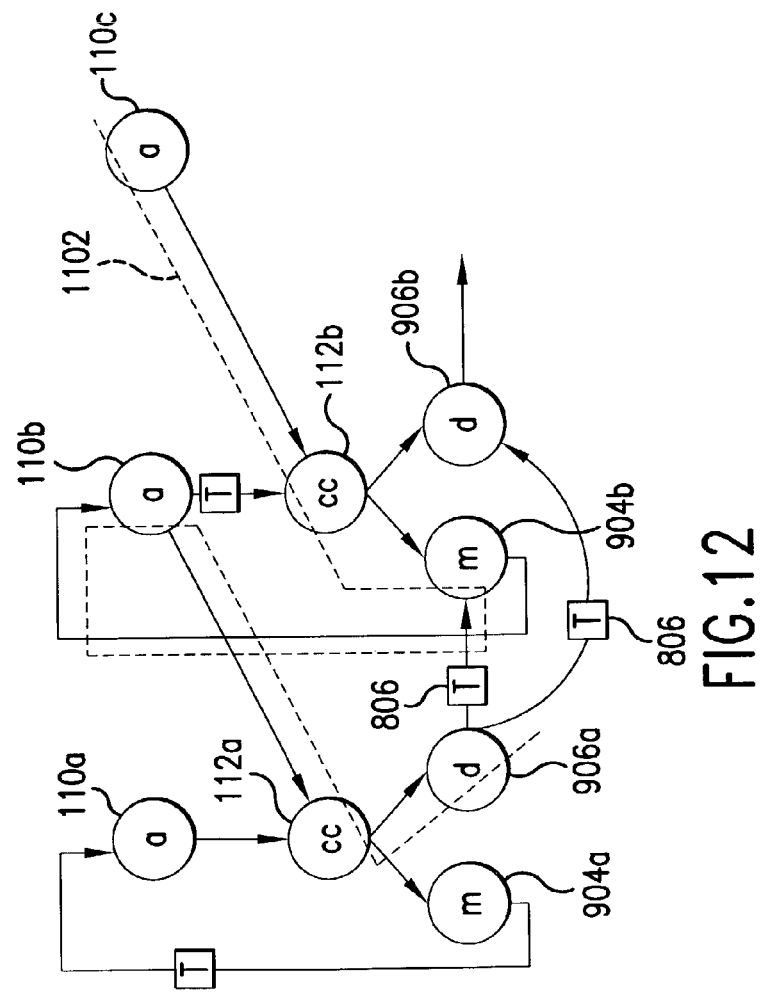
FIG. 12 is a circuit diagram for a critical path of the circuit of FIG. 11.

FIG. 12 illustrates a detailed view of the critical path 1102 of circuit 1100.

As shown in FIG. 12, during the retiming of ACS unit 800 described above, delay devices 806 were placed between decision logic circuit 906*a* and maximum/minimum select circuit 904*b* and between decision logic circuit 906*a* and between decision logic circuit 906*b*. This is because the decision logic circuits 906 and the maximum/minimum select circuits 904 are conventionally not thought of and implemented as a single unit. This is also not so in accordance with the present invention.

Figure 13:
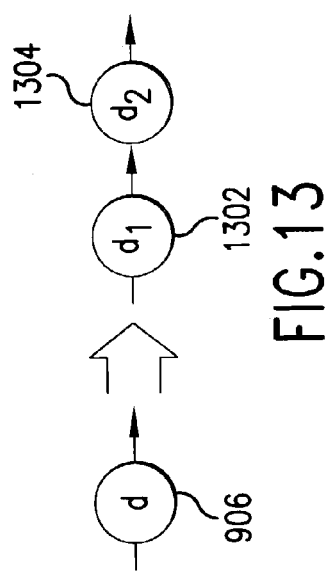
FIG. 13 illustrates how to segment a decision logic circuit to achieve advantageous retiming results.

As shown in FIG. 13, in accordance with the invention, decision logic device 906 can be divided into a first decision logic segment $(d_1)$ 1302 and a second decision logic segment $(d_2)$ 1304. This division allows for pipelining of the decision logic computations in accordance with the invention. The first decision logic segment 1302 has a first computation time $T_{d1}$. The second decision logic segment 1304 has a second computation time $T_{d2}$. By dividing up decision logic circuit 906 into two segments 1302 and 1304, it becomes possible to place a pipelining delay (e.g., a delay 806) between segment 1302 and segment 1304. Placing a delay between the two segments 1302 and 1304 shortens the path 1102 formed during retiming of ACS unit 800. This feature of the present invention is further described below with reference to FIG. 14A and FIG. 14B.

The computation times $T_{d1}$, and $T_{d2}$ represent the time required for each decision logic segment to perform its computation. In an embodiment of the present invention, the computation time $T_{d2}$ is set equal to a propagation delay time (T). The propagation delay time (T) is used to ensure that the calculations performed by the decision logic segment 1304 are completed at approximately the same time as the calculations performed in the code converter 112. Since decision logic segment 1304 and code converter 112 each provide an input to a decision logic segment 1302, it is advantageous in embodiments to have these input values available for input to decision logic segment 1302 at approximately the same time. Thus, in embodiments, the decision logic segment 1304 is designed to have a computation time approximately equal to the computation time of an adder 110 and code converter 112 (i.e., 0.4 ns+0.15 ns=0.55 ns or approximately 0.6 ns).

Although FIG. 13 illustrates dividing up decision logic circuit 906, the invention is not limited to dividing up just decision logic circuit 906 to achieve pipelining and better retiming results. Decision logic circuit 906 was selected for division in FIG. 13 because it had the longest computation time of the devices included in critical path 1102. In accordance with the present invention, other devices, units, or circuits in the critical path can be divided to achieve pipelining and better retiming results.

FIG. 14A illustrates a circuit 1400 formed from ACS unit 800 by dividing each of the decision logic circuits 906 of the MS circuits 114 into a first decision logic segment 1302 and a second decision logic segment 1304 as shown in FIG. 13. Four cut-sets 1402, 1404, 1406, and 1408 are shown in FIG. 14A. These four cut-sets are used to retime circuit 1400 and thereby form the circuit 1420 shown in FIG. 14B. As can be seen in FIG. 14A, the cut-set 1402 intersects the circuit branch between decision logic segment 1302$a$ and decision logic segment 1304$a$. The cut-set 1404 intersects the circuit branch between decision logic segment 1302$c$ and decision logic segment 1304$c$. The cut-set 1406 intersects the circuit branch between decision logic segment 1302$e$ and decision logic segment 1304$e$. The cut-set 1408 intersects the circuit branch between decision logic segment 1302$g$ and decision logic segment 1304$g$.

FIG. 14B illustrates the retimed circuit 1420 formed from circuit 1400. For the retimed circuit 1420, the path 1422 includes adders 110$b$ and 110$c$, code converters 112$a$ and 112$b$, maximum/minimum select circuit 904$a$, decision logic segment 1302$a$, and feedback path 804$b$. Using the typical computation times stated above for an 8-state Viterbi decode, the settling time of the path 1422 is approximately 2.5 ns. This time is the computation time of two adders 110 (0.4 ns +0.4 ns=0.8 ns), the computation time of two code converters 112 (0.15 ns+0.15 ns=0.3 ns), the computation time of one maximum/minimum select circuit 904 (0.8 ns), and the computation time of one decision logic segment 1302 (0.6 ns) (i.e., assuming segment 1304 has a computation time of 0.6 ns, the approximate computation time of an adder 110 and a code converter 112). This is less than the iteration bound of 2.55 ns (see loop 902 in FIG. 9B), thus path 1422 is no longer the critical path.

Two other paths present in circuit 1420 are path 1424 and path 1426. Path 1424 includes two adders 110, two code converters 112, and two maximum/minimum select circuits 904. Using the typical computation times stated above for an 8-state Viterbi decode, the settling time of the path 1424 is approximately 2.7 ns. This time is the computation time of two adders 110 (0.4 ns +0.4 ns=0.8 ns), the computation time of two code converters 112 (0.15 ns+0.15 ns=0.3 ns), and the computation time of two maximum/minimum select circuit 904 (0.8 ns+0.8 ns=1.6 ns). Path 1426 includes one decision logic segment 1304, one adder 110, code converter 112, and two maximum/minimum select circuits 904. Using the typical computation times stated above for an 8-state Viterbi decode, the settling time of the path 1424 is approximately 2.75 ns. This time is the computation time of one decision logic segment 1304 (0.6 ns), the computation time of one adder 110 (0.4 ns), the computation time of one code converter 112 (0.15 ns), and the computation time of two maximum/minimum select circuit 904 (0.8 ns+0.8 ns=1.6 ns). Thus, based on the above stated computation times, path 1424 is the critical path of circuit 1420.

For the retimed circuit 1420, using the typical computation times stated herein for a 4-state Viterbi decode, the settling time of the path 1424 is approximately 1.9 ns. This time is the computation time of two adders 110 (0.4 ns +0.4 ns=0.8 ns), the computation time of two code converters 112 (0.15 ns+0.15 ns=0.3 ns), and the computation time of two maximum/minimum select circuit 904 (0.4 ns+0.4 ns=0.8 ns). The settling time of the path 1424 is approximately 1.7 ns. This time is the computation time of one decision logic segment 1304 (0.35 ns or one-half of the total computation time (0.7 ns) of decision logic circuit 906), the computation time of one adder 110 (0.4 ns), the computation time of one code converter 112 (0.15 ns), and the computation time of two maximum/minimum select circuit 904 (0.4 ns+0.4 ns=0.8 ns). Based on these computation times, path 1424 is the critical path for a 4-state Viterbi decoder.

As would be known to persons skilled in the relevant arts, once the critical path of a circuit has been determined, a clock period for the circuit can be set equal to the settling time of the critical path plus a margin factor.

Table 2 below shows the iteration bound and critical path results for a 4-state Viterbi decoder and an 8-state Viterbi decoder designed in accordance with both the pipelining and retiming techniques of the present invention described herein.

TABLE 2

|  | 4-State Viterbi Decoder | 8-State Viterbi Decoder |
| --- | --- | --- |
| Iteration Bound | 1.65 | 2.55 |
| Critical Path | 1.9 | 2.75 |

As shown in Table 2, the present invention achieves critical path computation times that are close to the iteration bound. Such computation times are not possible using conventional design techniques.

Figure 15:
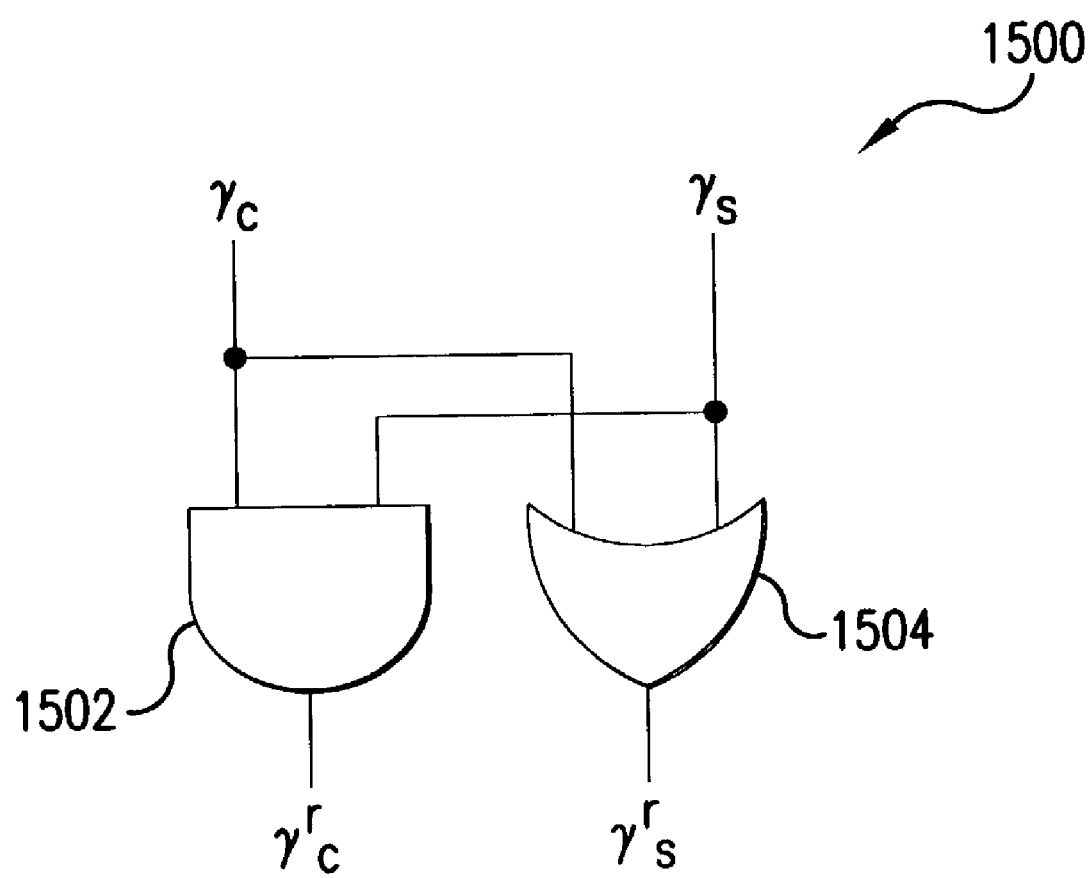
FIG. 15 is a circuit diagram of a code converter.

FIG. 15 illustrates an example circuit 1500 that can be used to implement code converter 112 in embodiments of the invention. Circuit 1500 includes an AND gate 1502 and an OR gate 1504. Circuit 1500 recodes input sum and carry bits as illustrated in Table 3 below. The digit (C, S) equals (1, 0) is not permitted.

TABLE 3

| | Original Bits | | Recoded Bits | |
| --- | --- | --- | --- | --- |
| $\gamma$ | $\gamma_C$ | $\gamma_S$ | $\gamma_C^r$ | $\gamma_S^r$ |
| 0 | 0 | 0 | 0 | 0 |
| 1 | 0 | 1 | 0 | 1 |
| 1 | 1 | 0 | 0 | 1 |
| 2 | 1 | 1 | 1 | 1 |

Figure 16:
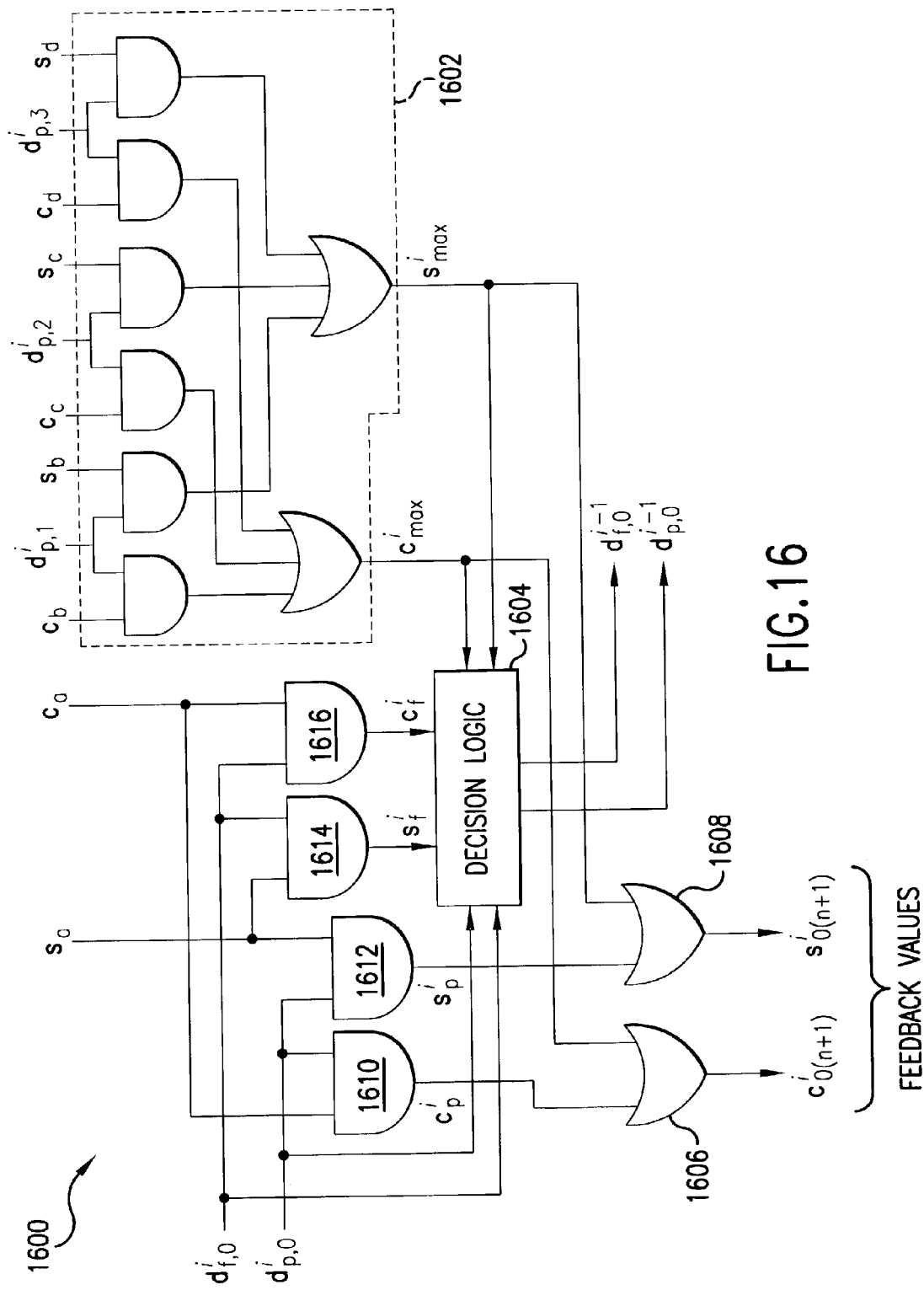
FIG. 16 is a circuit diagram of a maximum select circuit.

FIG. 16 illustrates an example circuit 1600 for implementing MS circuit 114 in embodiments of the invention. Circuit 1600 performs bit-level maximum-select operations for a four-digit sequence $\{(C_A, S_A), (C_B, S_B), (C_C, S_C), (C_D, S_D)\}$.

Circuit 1600 operates as follows. A maximum select circuit 1602 is used to select the maximum digit of the digits $(C_B, S_B)$, $(C_C, S_C)$, and $(C_D, S_D)$. This maximum digit is shown in FIG. 16 as $(C^i_{MAX}, S^i_{MAX})$ The digit $(C^i_{MAX}, S^i_{MAX})$ is passed to decision logic circuit 1604. $C^i_{MAX}$ is passed to OR gate 1606. $S^i_{MAX}$ is passed to OR gate 1608. The digit $(C_A, S_A)$ is combined with a preliminary decision value $d^i_{p,0}$ using AND gates 1610 and 1612 to produce a preliminary digit $(C^i_p, S^i_p)$. $C^i_p$ is provided to OR gate 1606. $S^i_p$ is provided to OR gate 1608. OR gates 1606 and 1608 are used to select the maximum digit $(C^i_{0(n+1)}, S^i_{0(n+1)})$ of the two digits $(C^i_p, S^i_p)$ and $(C^i_{MAX}, S^i_{MAX})$. The maximum digit $(C^i_{0(n+1)}, S^i_{0(n+1)})$ is fed back to an adder 110 (not shown).

As shown in FIG. 16, decision state values $d^i_{f,0}$ and $d^i_{p,0}$ are used in the selection of maximum digit ($C^i_{0(n+1)}$, $S^i_{0(n+1)}$). The value $d^i_{f,0}$ is a final decision state value. The value $d^i_{p,0}$ is a preliminary decision state value. When the values of the decision state values $d^i_{f,0}$ and $d^i_{p,0}$ equal (0, 0), the preliminary digit ($C^i_p, S^i_p$) has lost in the comparison to digit ($C^i_{MAX}, S^i_{MAX}$) to be selected as the maximum digit ($C^i_{0(n+1)}, S^i_{0(n+1)}$). When the values of the decision state values $d^i_{f,0}$ and $d^i_{p,0}$ equal (0, 1), the preliminary digit ($C^i_p, S^i_p$) still has the potential to be selected over the digit ($C^i_{MAX}, S^i_{MAX}$) as the maximum digit ($C^i_{0(n+1)}, S^i_{0(n+1)}$). When the values of the decision state values $d^i_{f,0}$ and $d^i_{p,0}$ equal (1, 1), the preliminary digit ($C^i_p, S^i_p$) is winning the comparison to digit ($C^i_{MAX}, S^i_{MAX}$) to be selected as the maximum digit ($C^i_{0(n+1)}, S^i_{0(n+1)}$) The decision state values $d^i_{f,0}$ and $d^i_{p,0}$ may never equal (1, 0).

The inputs to the decision logic circuit 1604 include the values $C^i_{MAX}, S^i_{MAX}, d^i_f, d^i_p, C^i_f$, and $S^i_f$. The digit ($C_A, S_A$) is combined with the final decision value $d^i_{f,0}$ using AND gates 1614 and 1616 to produce the final digit value ($C^i_f, S^i_f$). Using some or all of these inputs, decision logic circuit 1604 computes two decision state values $d^{i-1}_{f,0}$ and $d^{i-1}_{p,0}$.

Figure 17:
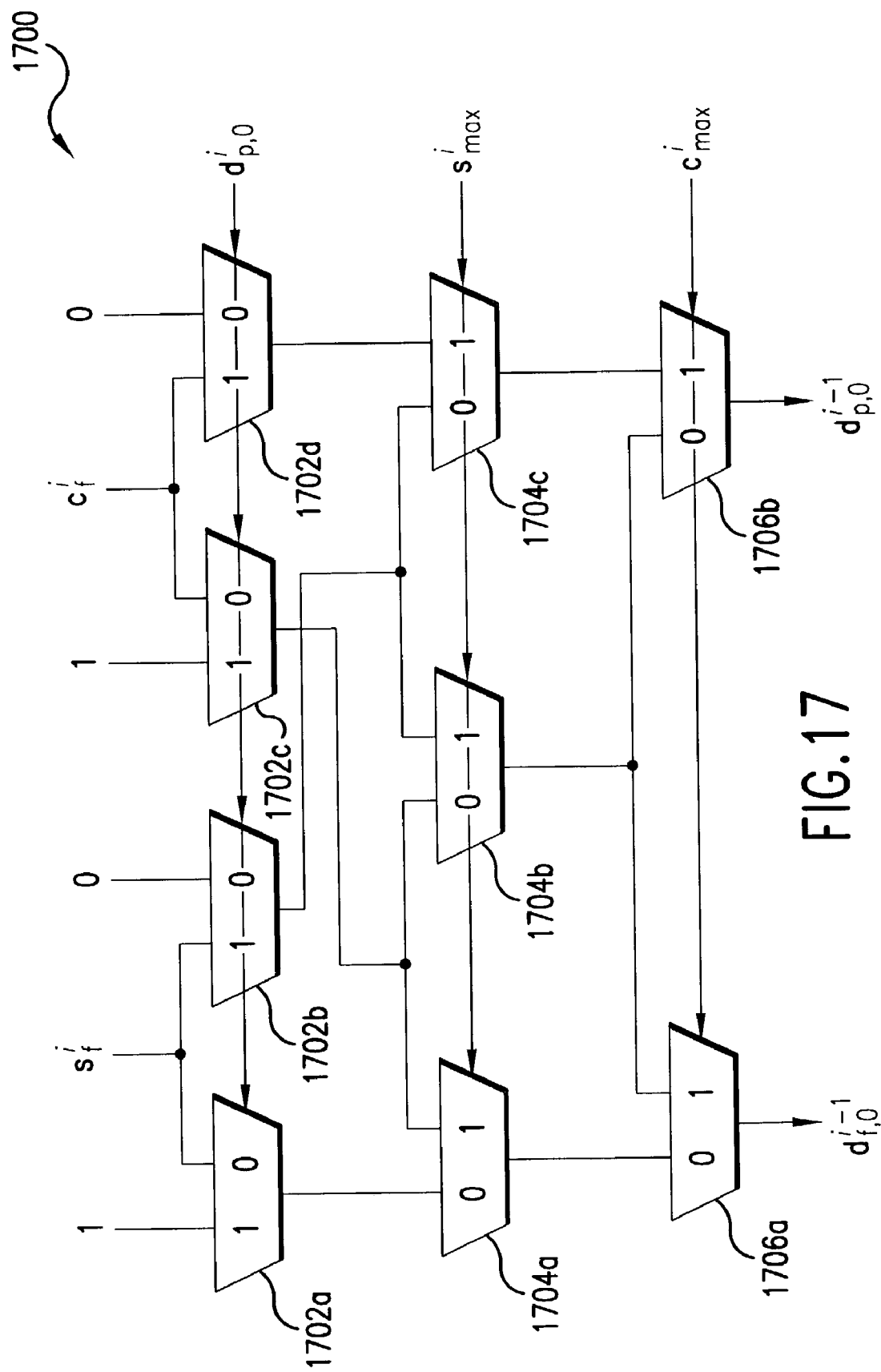
FIG. 17 is a circuit diagram of a decision logic circuit.

FIG. 17 illustrates an example circuit 1700 that can be used for the decision logic circuit 1604 shown in FIG. 16. Circuit 1700 includes three stages of 2-to-1 multiplexers. The first stage includes 2-to-1 multiplexers 1702a, 1702b, 1702c and 1702d. The second stage includes 2-to-1 multiplexers 1704a, 1704b, and 1704c. The third stage includes 2-to-1 multiplexers 1706a and 1706b. The inputs to the first stage of 2-to-1 multiplexers include $C^i_f, S^i_f$, and $d^i_p$. The inputs to the second stage of 2-to-1 multiplexers include $S^i_{MAX}$ and the outputs of the first stage of 2-to-1 multiplexers. The inputs to the third stage of 2-to-1 multiplexers include $C^i_{MAX}$ and the outputs of the second stage of 2-to-1 multiplexers.

Circuit 1700 generates the two decision state values $d^{i-1}_{f,0}$ and $d^{i-1}_{p,0}$ in accordance with the mapping shown in Table 4 below.

TABLE 4

| Inputs | | | Outputs | |
|---|---|---|---|---|
| $d^i_p$ | $d^i_f$ | $(C^i_f, S^i_f)-(C^i_{MAX}, S^i_{MAX})$ | $d^{i-1}_p$ | $d^{i-1}_f$ |
| 1 | 1 | −2 | 0 | 0 |
| 1 | 1 | −1 | 0 | 1 |
| 1 | 1 | ≧0 | 1 | 1 |
| 0 | 1 | ≦0 | 0 | 0 |
| 0 | 1 | 1 | 0 | 1 |
| 0 | 1 | 2 | 1 | 1 |
| 0 | 0 | X | 0 | 0 |

Figure 18:
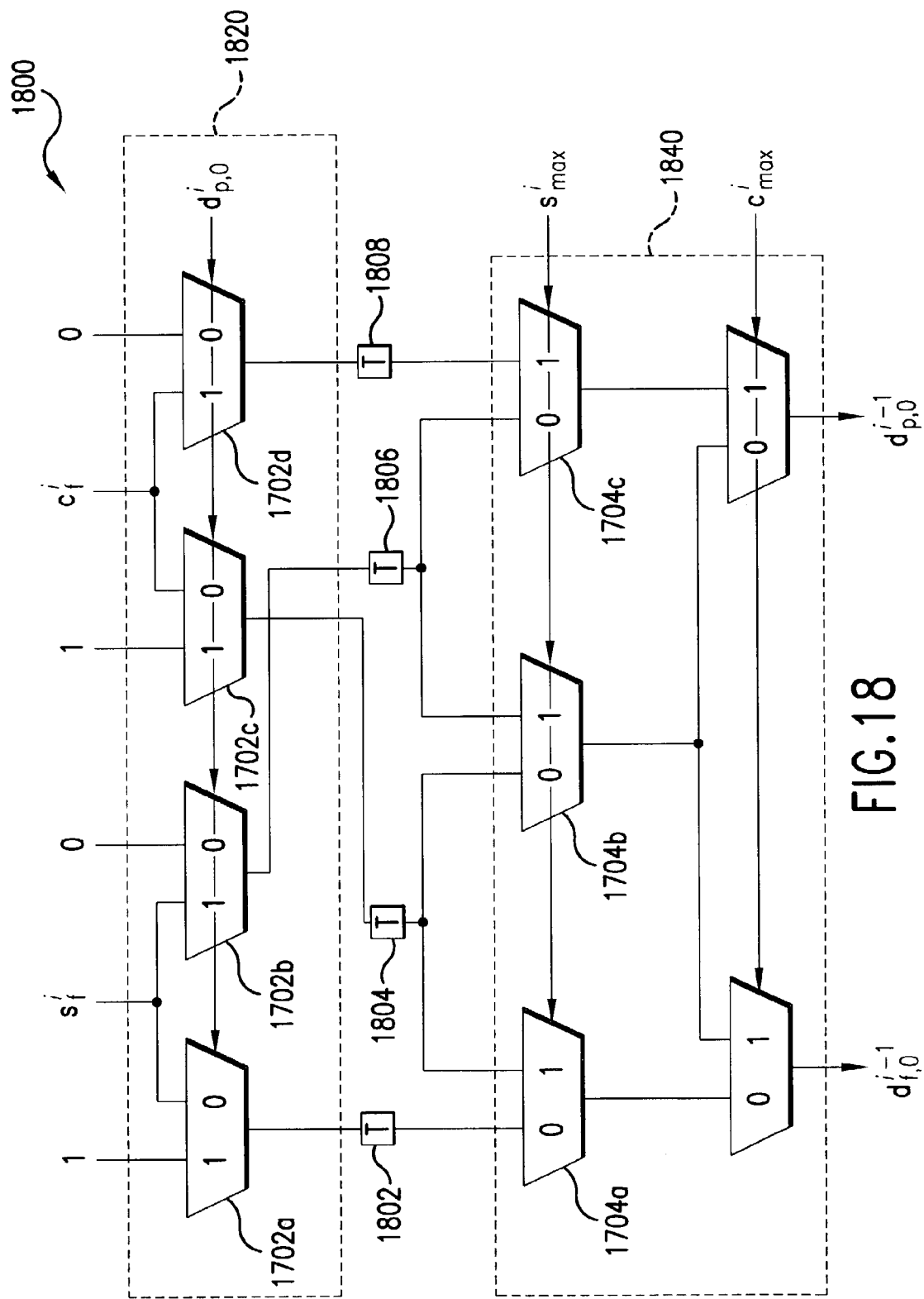
FIG. 18 is a circuit diagram of a decision logic circuit.

FIG. 18 illustrates a circuit 1800 formed by applying the pipelining technique of the present invention to the circuit 1700. As shown in FIG. 18, circuit 1800 includes four delays 1802, 1804, 1806, and 1808. Delay 1802 is located in the circuit branch connecting the output of 2-to-1 multiplexer 1702a to the input of 2-to-1 multiplexer 1704a. Delay 1804 is located in the circuit branch connecting the output of 2-to-1 multiplexer 1702c to the inputs of 2-to-1 multiplexers 1704a and 1704b. Delay 1806 is located in the circuit branch connecting the output of 2-to-1 multiplexer 1702b to the inputs of 2-to-1 multiplexers 1704b and 1704c. Delay 1808 is located in the circuit branch connecting the output of 2-to-1 multiplexer 1702d to the input of 2-to-1 multiplexer 1704c.

The four delays 1802, 1804, 1806, and 1808 in circuit 1800 divide the circuit 1800 into part of a first decision logic segment 1820 and a second decision logic segment 1840. The first decision logic segment 1820 includes the four 2-to-1 multiplexers 1702a–d (shown in FIG. 18), the maximum select circuit 1602 (shown in FIG. 16), and the two AND gates 1614 and 1616 (shown in FIG. 16). Assume the computation time of each 2-to-1 multiplexer in circuit 1800 is approximately 0.2 ns. Further assume, the computation time of AND gates 1614 and 1616 are 0.2 ns each, and the computation time of maximum select circuit 1602 is 0.4 ns. Then, the operating time or critical path of decision logic segment 1820 is approximately 0.4 ns. The operating time of decision logic segment 1840 is also approximately 0.4 ns.

Figure 19:
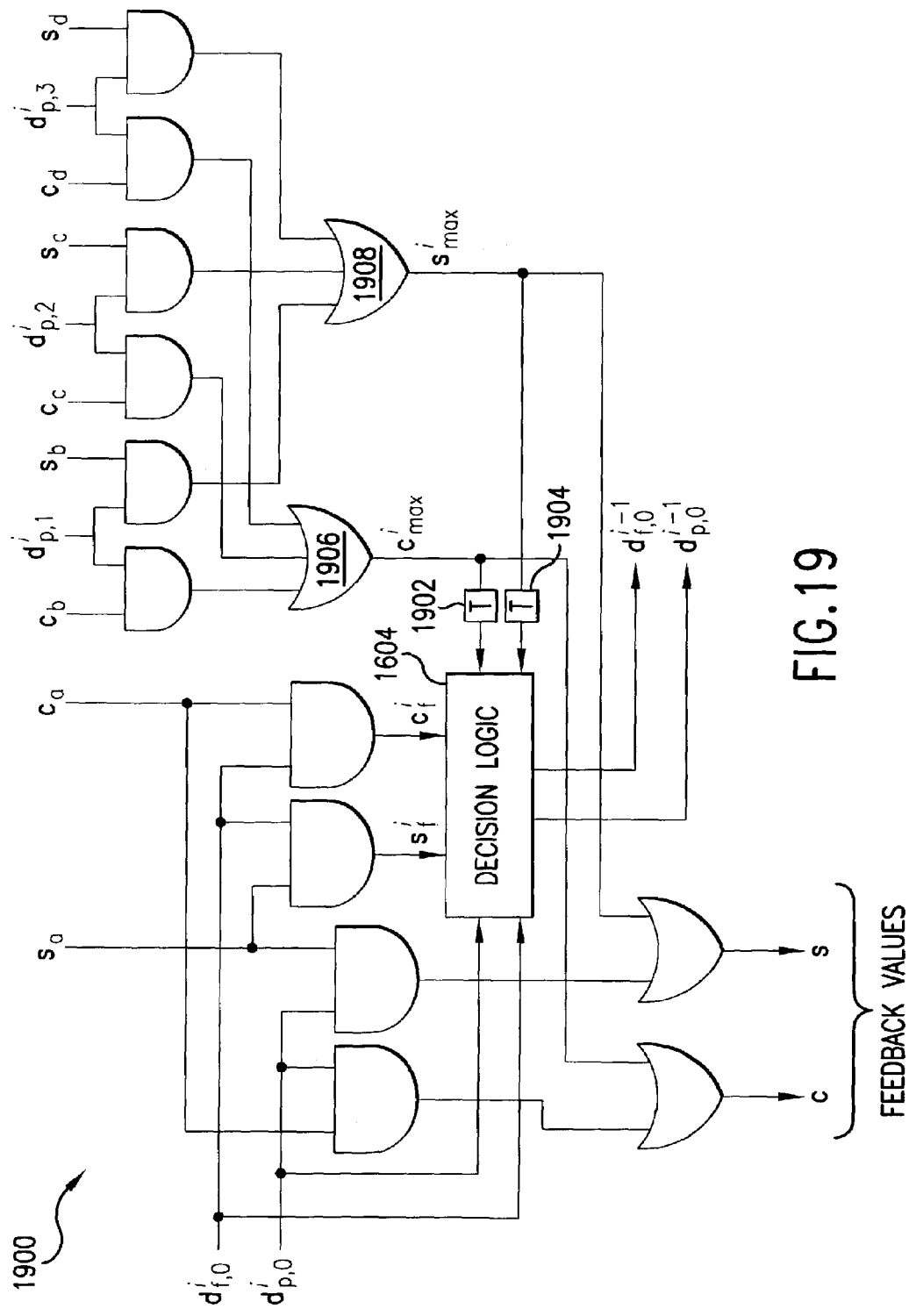
FIG. 19 is a circuit diagram of a maximum select circuit.

FIG. 19 illustrates a circuit 1900 formed by applying the pipelining technique of the present invention to the circuit 1600. As shown in FIG. 19, circuit 1900 includes two delays 1902 and 1904. Delay 1902 is located in the circuit branch that connect OR gate 1906 to the decision logic circuit 1604. Delay 1904 is located in the circuit branch that connect OR gate 1908 to the decision logic circuit 1604.

Figure 20:
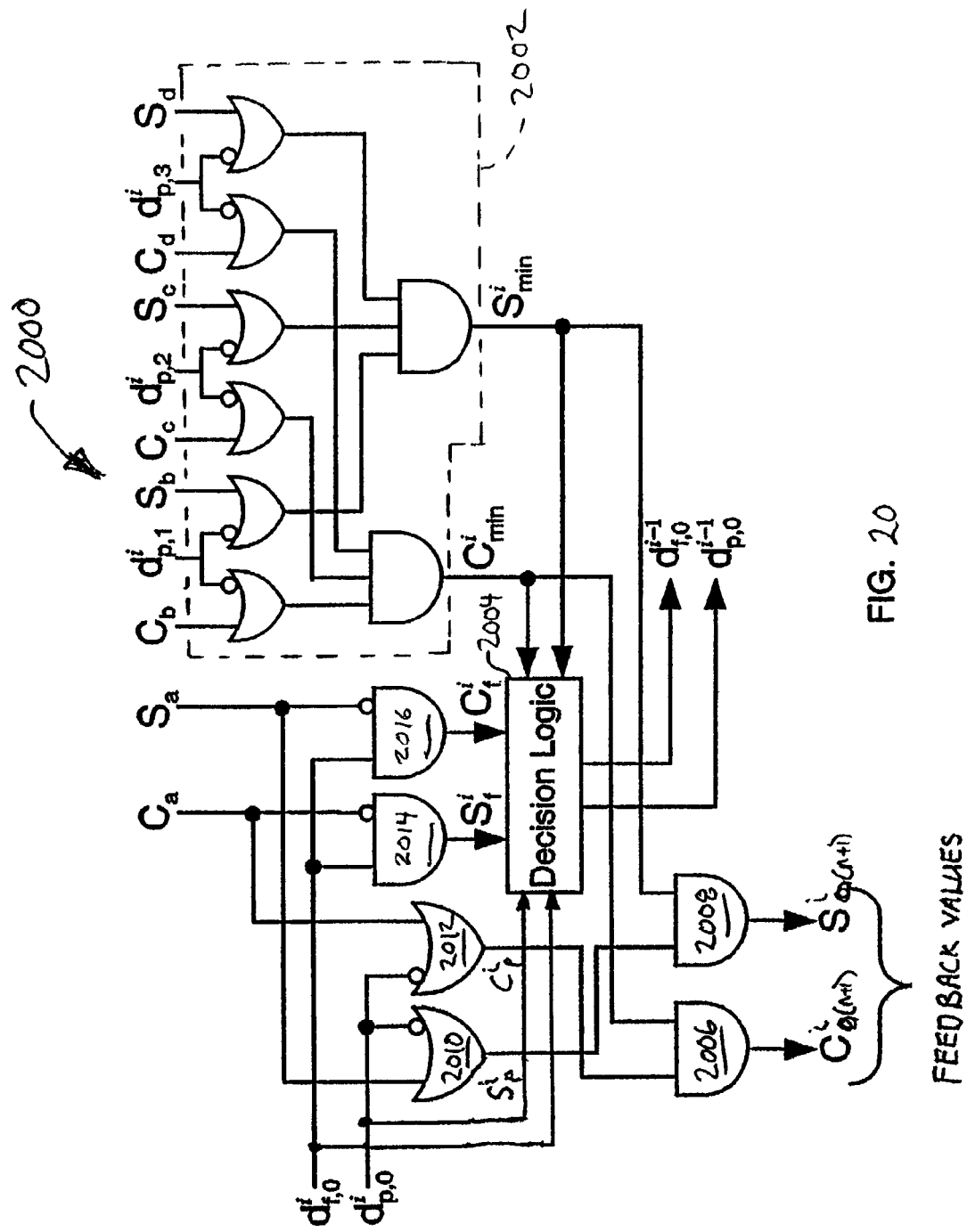
FIG. 20 is a circuit diagram of a minimum select circuit.

FIG. 20 illustrates a minimum-select circuit 2000 that can be used to implement a minimum-select embodiment of MS circuit 114. Circuit 2000 operates as follows. A minimum select circuit 2002 is used to select the minimum digit of the digits ($C_B, S_B$), ($C_C, S_C$), and ($C_D, S_D$). This minimum digit is shown in FIG. 20 as ($C^i_{MIN}, S^i_{MIN}$) The digit ($C^i_{MIN}, S^i_{MIN}$) is passed to decision logic circuit 2004. $C^i_{MIN}$ is passed to AND gate 2006. $S^i_{MIN}$ is passed to AND gate 2008. The digit ($C_A, S_A$) is combined with a preliminary decision value $d^i_{p,0}$ using OR gates 2010 and 2012 to produce a preliminary digit ($C^i_p, S^i_p$). $C^i_p$ is provided to AND gate 2006. $S^i_p$ is provided to AND gate 2008. AND gates 2006 and 2008 are used to select the minimum digit ($C^i_{0(n+1)}, S^i_{0(n+1)}$) of the two digits ($C^i_p, S^i_p$) and ($C^i_{MIN}, S^i_{MIN}$). The minimum digit ($C^i_{0(n+1)}, S^i_{0(n+1)}$) is fed back to an adder 110 (not shown). Features similar to those described above with reference to circuit 1600 are also found in circuit 2000.

Figure 21:
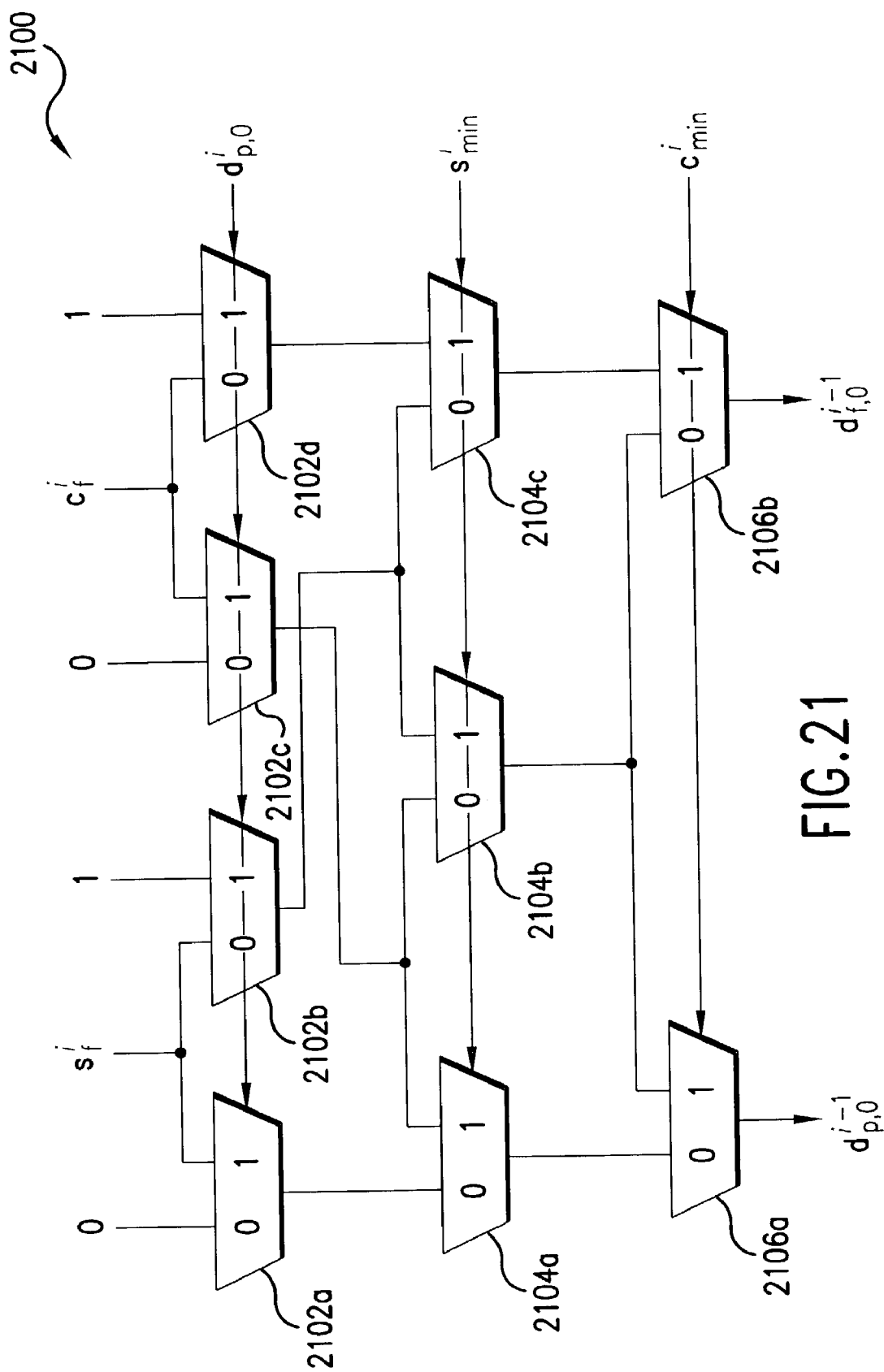
FIG. 21 is a circuit diagram of a decision logic circuit.

FIG. 21 illustrates an example circuit 2100 that can be used for the decision logic circuit 2004 shown in FIG. 20. Circuit 2100 includes three stages of 2-to-1 multiplexers. The first stage includes 2-to-1 multiplexers 2102a, 2102b, 2102c and 2102d. The second stage includes 2-to-1 multiplexers 2104a, 2104b, and 2104c. The third stage includes 2-to-1 multiplexers 2106a and 2106b. The inputs to the first stage of 2-to-1 multiplexers include $C^i_f, S^i_f$, and $d^i_p$. The inputs to the second stage of 2-to-1 multiplexers include $S^i_{MIN}$ and the outputs of the first stage of 2-to-1 multiplexers. The inputs to the third stage of 2-to-1 multiplexers include $C^i_{MIN}$ and the outputs of the second stage of 2-to-1 multiplexers.

Circuit 2100 generates two decision state values $d^{i-1}_{f,0}$ and $d^{i-1}_{p,0}$ in accordance with the mapping shown in Table 5 below.

TABLE 5

| Inputs | | | Outputs | |
|---|---|---|---|---|
| $d^i_p$ | $d^i_f$ | $(C^i_f, S^i_f)-(C^i_{MAX}, S^i_{MAX})$ | $d^{i-1}_p$ | $d^{i-1}_f$ |
| 1 | 1 | 2 | 0 | 0 |
| 1 | 1 | 1 | 0 | 1 |
| 1 | 1 | ≦0 | 1 | 1 |
| 0 | 1 | ≧0 | 0 | 0 |
| 0 | 1 | −1 | 0 | 1 |
| 0 | 1 | −2 | 1 | 1 |
| 0 | 0 | X | 0 | 0 |

Figure 22:
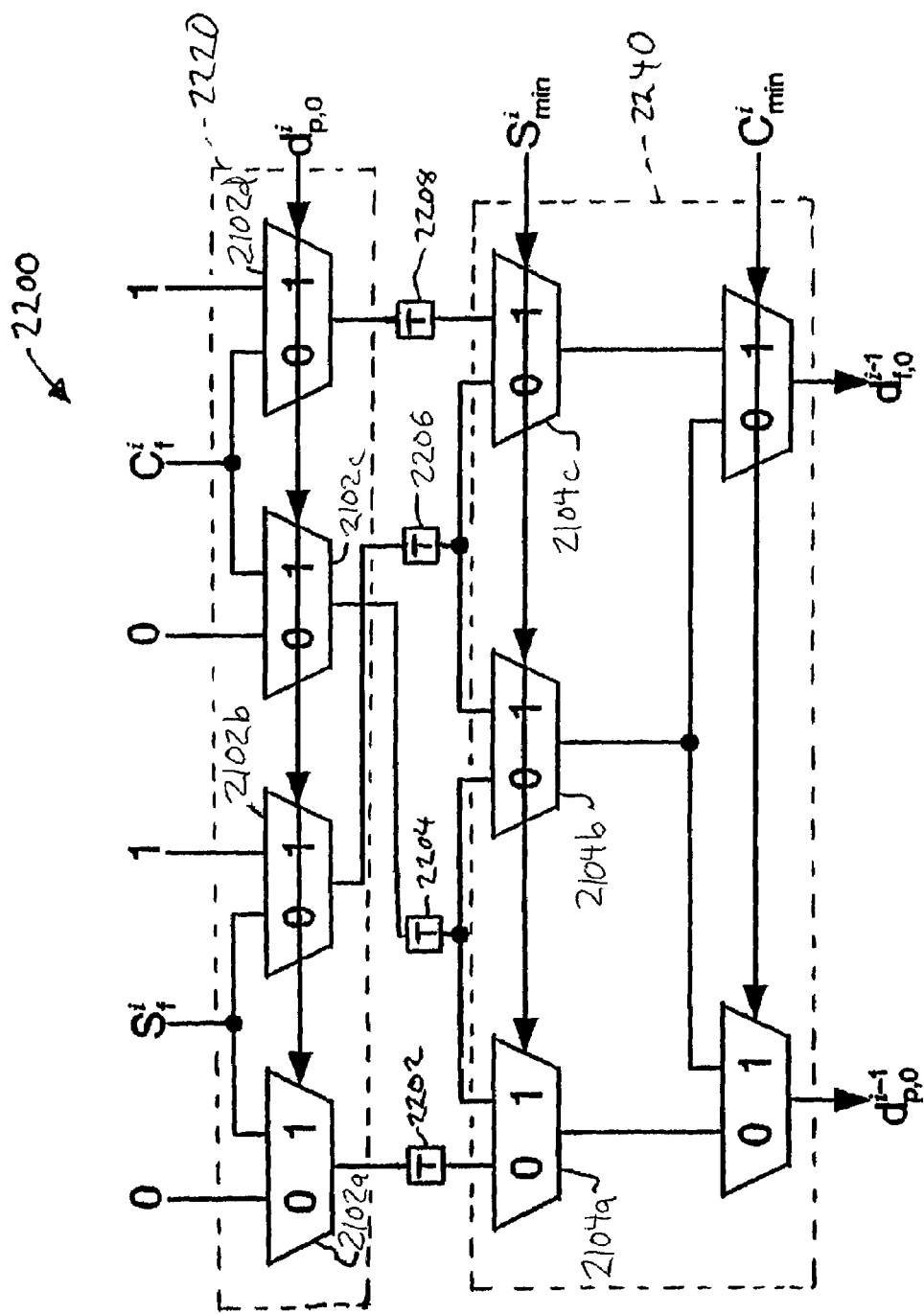
FIG. 22 is a circuit diagram of a decision logic circuit.

FIG. 22 illustrates a circuit 2200 formed by applying the pipelining technique of the present invention to the circuit 2100. As shown in FIG. 22, circuit 2200 includes four delays 2202, 2204, 2206, and 2208. Delay 2202 is located in the circuit branch connecting the output of 2-to-1 multiplexer 2102a to the input of 2-to-1 multiplexer 2104a. Delay 2204 is located in the circuit branch connecting the output of 2-to-1 multiplexer 2102c to the inputs of 2-to-1 multiplexers 2104a and 2104b. Delay 2206 is located in the circuit branch connecting the output of 2-to-1 multiplexer 2102b to the inputs of 2-to-1 multiplexers 2104b and 2104c. Delay 2208 is located in the circuit branch connecting the output of 2-to-1 multiplexer 2102d to the input of 2-to-1 multiplexer 2104c.

The four delays 2202, 2204, 2206, and 2208 in circuit 2200 divide the circuit 2200 into part of a first decision logic segment 2220 and a second decision logic segment 2240. The first decision logic segment 2220 includes the four 2-to-1 multiplexers 2102a–d (shown in FIG. 22), the minimum select circuit 2002 (shown in FIG. 20), and the two AND gates 2014 and 2016 (shown in FIG. 20). Assume the computation time of each 2-to-1 multiplexer in circuit 2200 is approximately 0.2 ns. Further assume, the computation time of AND gates 2014 and 2016 are 0.2 ns each, and the computation time of minimum select circuit 2002 is 0.4 ns. Then, the operating time or critical path of decision logic segment 2220 is approximately 0.4 ns. The operating time of decision logic segment 2240 is also approximately 0.4 ns.

Figure 23:
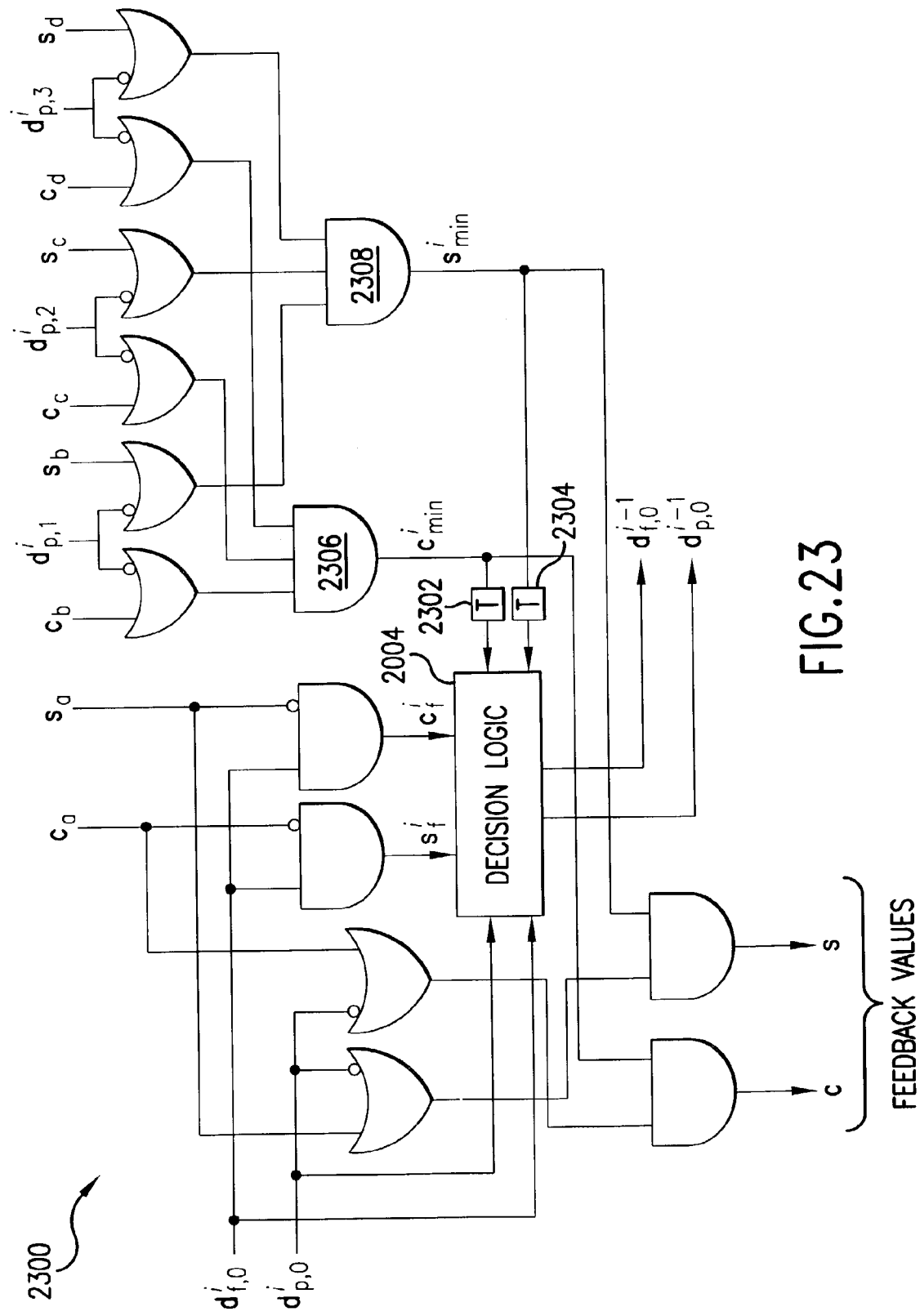
FIG. 23 is a circuit diagram of a minimum select circuit.

FIG. 23 illustrates a circuit 2300 formed by applying the pipelining technique of the present invention to the circuit 2000. As shown in FIG. 23, circuit 2300 includes two delays 2302 and 2304. Delay 2302 is located in the circuit branch that connect AND gate 2306 to the decision logic circuit 2004. Delay 2304 is located in the circuit branch that connect AND gate 2308 to the decision logic circuit 2004.

Figure 24B:
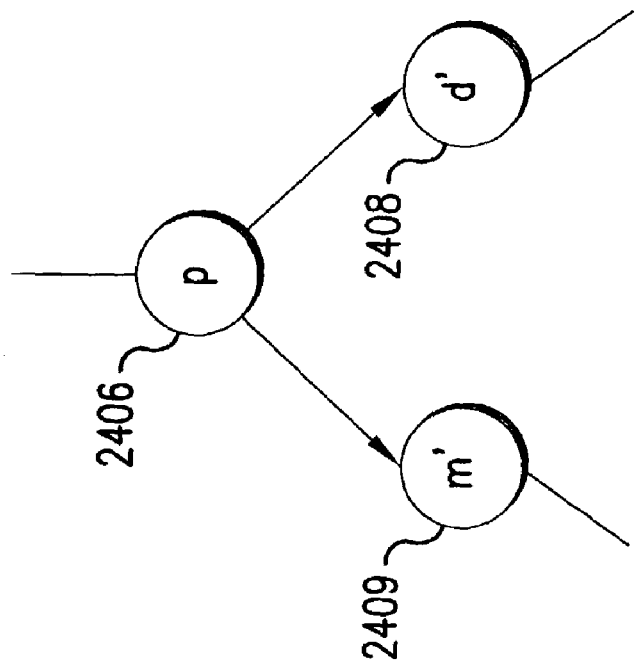
FIGS. 24A and 24B illustrate how to implement a pre-processing block.
Figure 24A:
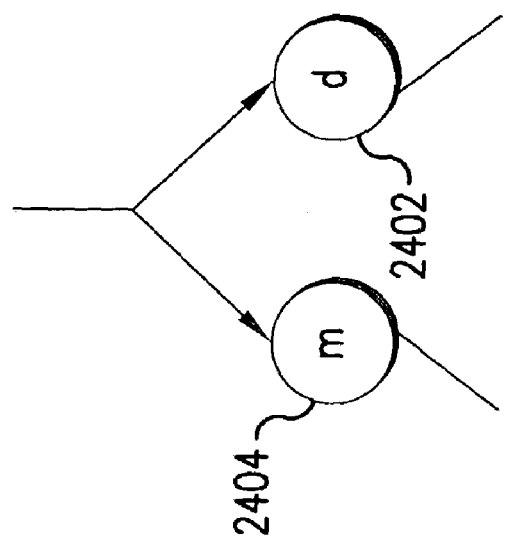
Figure 11:
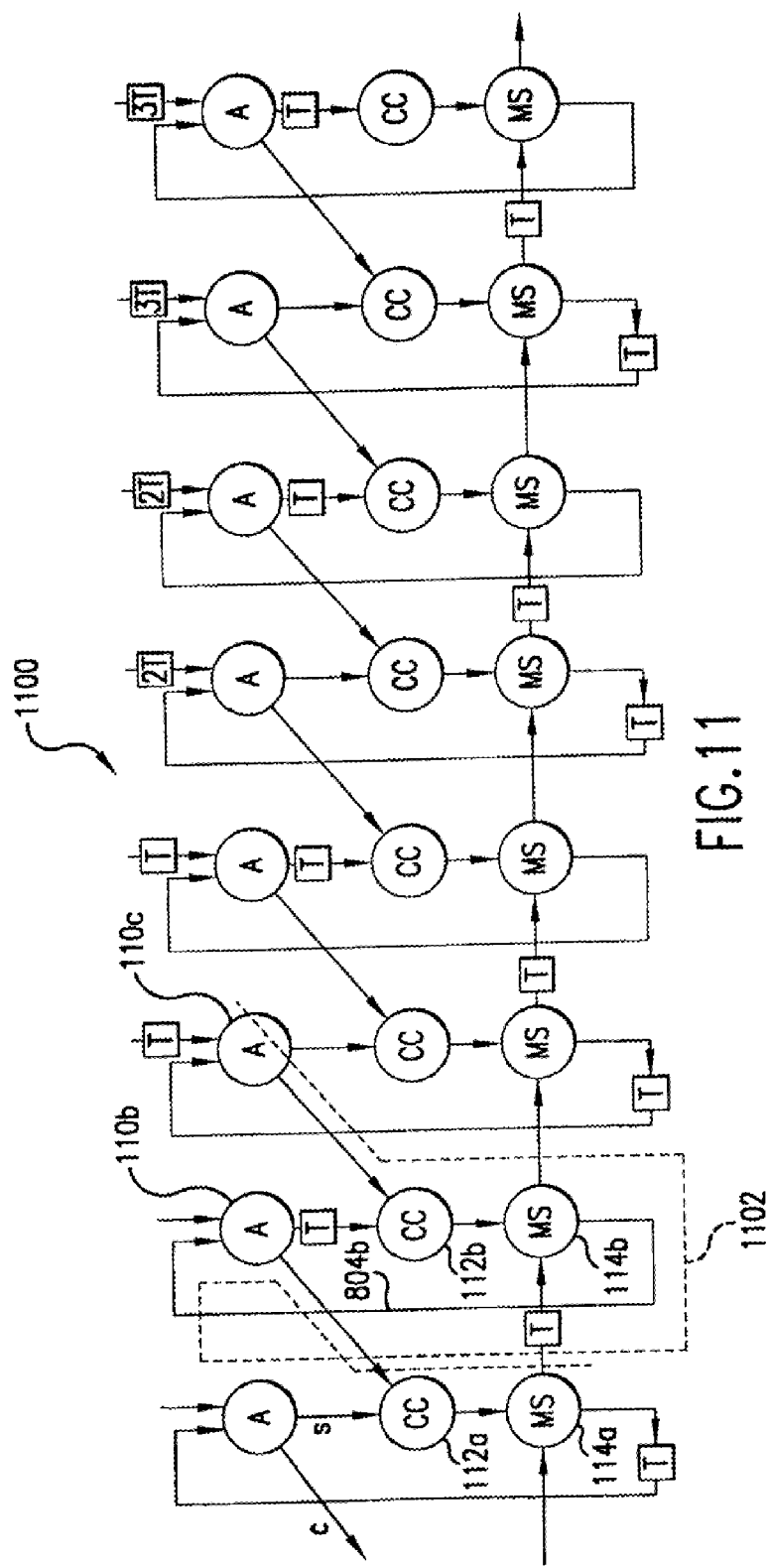
Figure 20:
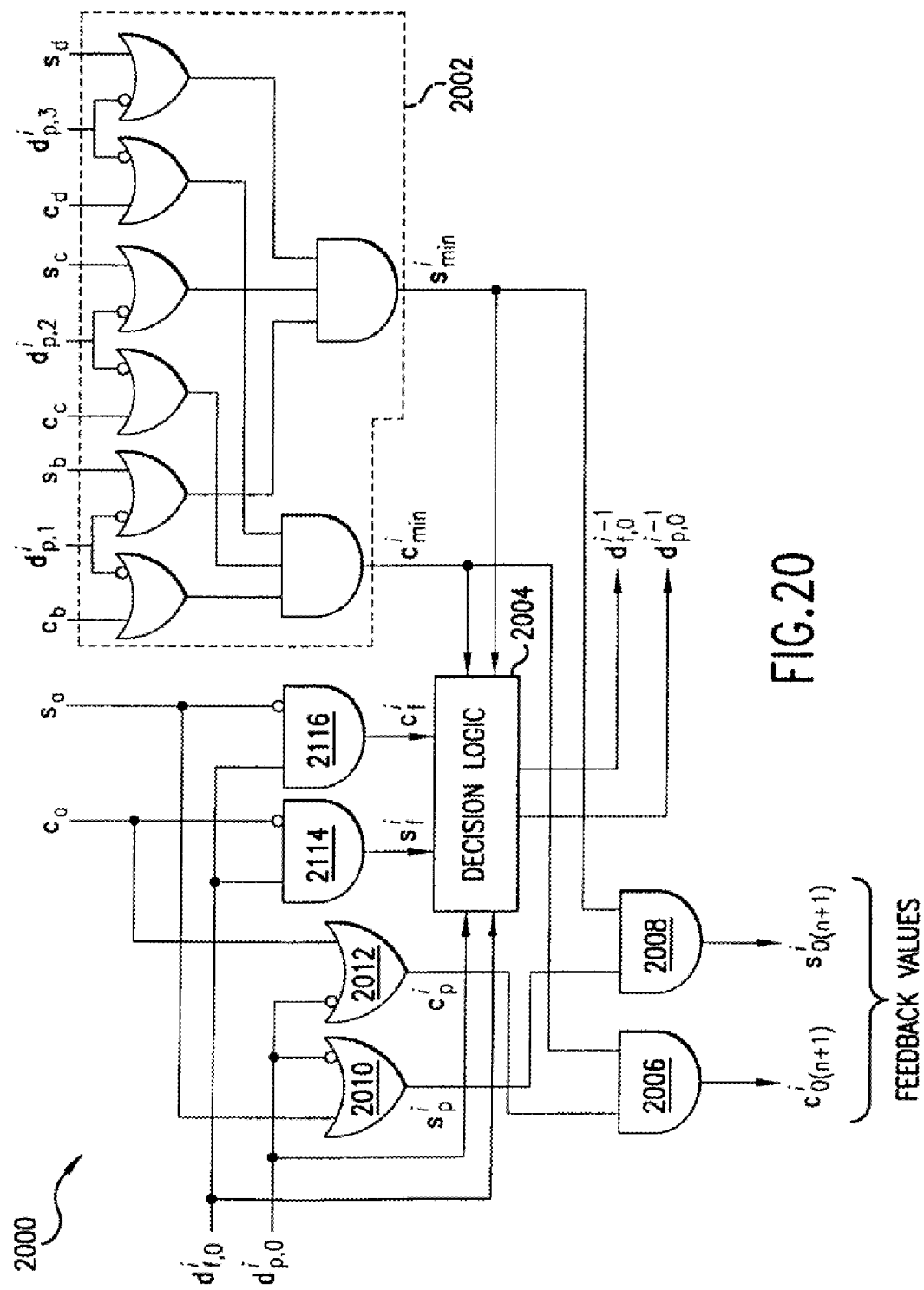
Figure 22:
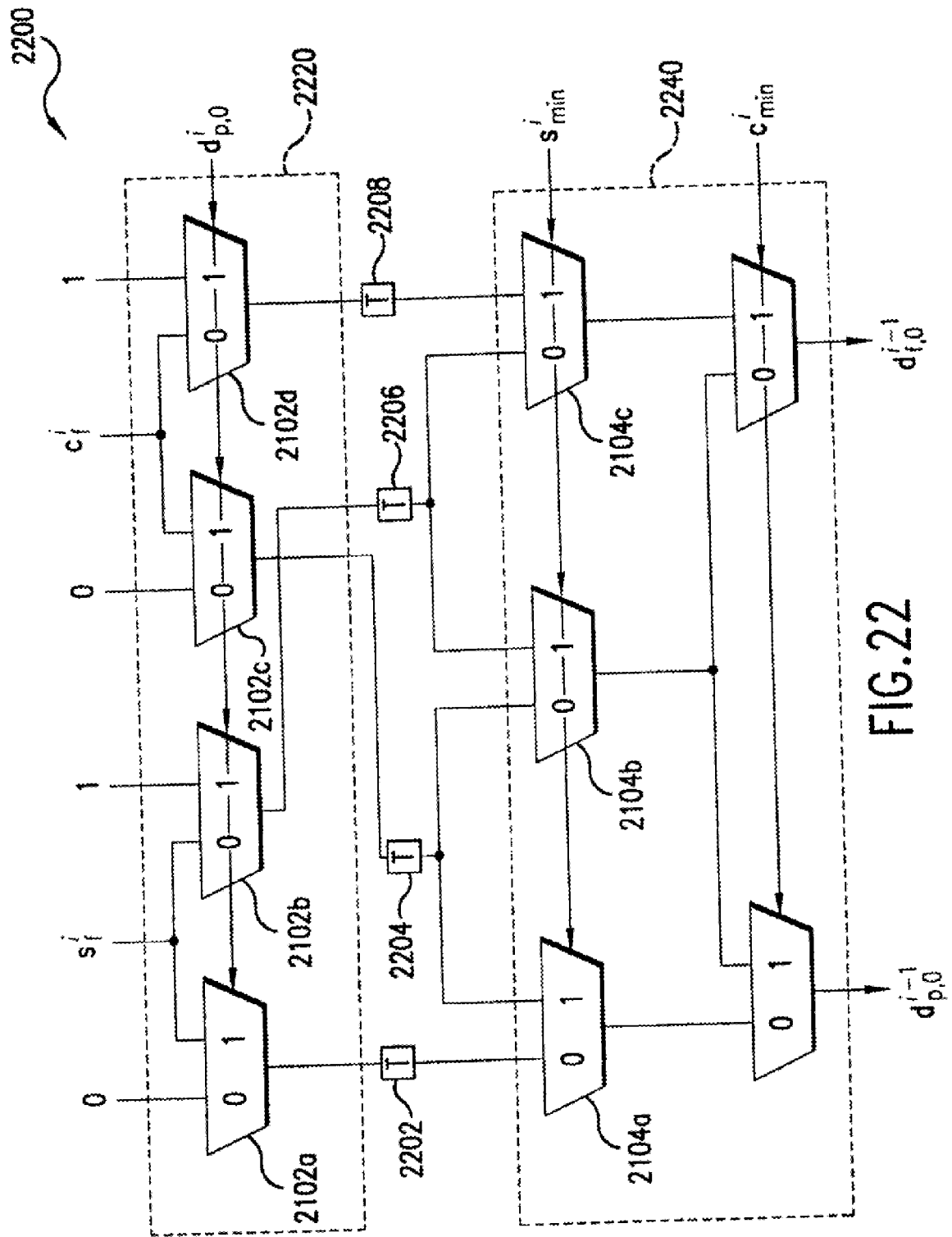

Referring to FIG. 24A and FIG. 24B, it has been observed that a number of common computations are used by the various decision logic circuits and the various maximum/minimum select circuits described herein. These decision logic circuits and maximum/minimum select circuits are represented in FIG. 24A by a decision logic circuit 2402 and a maximum/minimum select circuit 2404. Accordingly, in an embodiment of the present invention, a preprocessing block 2406 is provided to calculate at least one common computation for use by the decision logic circuit 2402 and the maximum/minimum select circuit 2404. This allows for the removal of at least some common hardware from decision logic circuit 2402 and the maximum/minimum select circuit 2404 to form the decision logic circuit 2408 and the maximum/minimum select circuit 2409 shown in FIG. 24B.

As described herein, the present invention can be used to design and implement high-speed digital communications circuits and systems that cannot be designed and implemented using conventional circuits and techniques. This point is illustrated by the following example.

Consider, for a moment, how to implement a 10 Gb/s Viterbi decoder. As would be known to persons skilled in the relevant arts, in order to implement a 10 Gb/s Viterbi decoder some form of parallel Viterbi decoding using lookahead or a sliding block Viterbi decoder is needed. In a conventional implementation, an 8-state Viterbi decoder requires a clock period of at least 3.4 ns. This is based on a 3.1 ns critical path and a clock setup/hold time of 0.3 ns. Unfortunately, this does not permit a 32-parallel design using conventional MSB-first pipelined operations because a 32-parallel design must be clocked with a clock period of 3.2 ns to achieve a decoding speed of 10 Gb/s. Thus, using conventional circuits and design techniques, a 10 Gb/s Viterbi decoder must be implemented using either a 64-parallel design in a look-ahead Viterbi decoder or a 48-parallel design in a sliding-block Viterbi decoder. In a look-ahead parallel Viterbi decoder, the level of parallelism is constrained to be a power of two (e.g., $2^x$). In a sliding-block Viterbi decoder, the level of parallelism is assumed to be a multiple of eight (e.g., 8×).

Using the circuits and methods of the present invention described herein, an 8-state Viterbi decoder can be implemented that has a critical path of only 2.7 ns. How this is achieved is described above. Thus, using a clock setup/hold time of 0.3 ns, an 8-state Viterbi decoder designed and implemented in accordance with the present invention can be clocked with a clock period of 3 ns. In this way, a 32-parallel implementation for achieving a 10 Gb/s Viterbi decoder is feasible.

Further features and advantages of the present invention will become apparent to persons skilled in the relevant arts given the description herein.

CONCLUSION

Various embodiments of the present invention have been described above. It should be understood that these embodiments have been presented by way of example only, and not limitation. It will be understood by those skilled in the relevant arts that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. An add-compare-select circuit, comprising:

an adder having an input port, a sum output port, and a carry output port;

a first code converter having an input port and an output port, said input port of said first code converter coupled to said sum output port of said adder;

a second code converter having an input port and an output port, said input port of said second code converter coupled to said carry output port of said adder;

a maximum select circuit having a first input port, a second input port, and an output port, said first input port of said maximum select circuit coupled to said output port of said first code converter and said output port of said maximum select circuit coupled to said input port of said adder;

a first decision logic circuit having an input port and an output port, said input port of said first decision logic circuit coupled to said output port of said second code converter;

a delay circuit having an input port and an output port, said input port of said delay circuit coupled to said output port of said first decision logic circuit; and a second decision logic circuit having an input port and an output port, said input port of said second decision logic circuit coupled to said output port of said delay circuit and said output port of said second decision logic circuit coupled to said second input port of said maximum select circuit, wherein said first decision logic circuit and said second decision logic circuit are used to compute a preliminary decision value and a final decision value.

2. The add-compare-select circuit of claim 1, wherein the add-compare-select circuit forms part of an integrated circuit.

3. The add-compare-select circuit of claim 1, wherein the add-compare-select circuit forms part of a digital communications device.

4. The add-compare-select circuit of claim 1, wherein the add-compare-select circuit forms part of a Viterbi decoder.

5. The add-compare-select circuit of claim 1, wherein said first decision logic circuit and said second decision logic circuit each comprise a plurality of 2-to-1 multiplexers.

6. An add-compare-select circuit, comprising:
a an adder having an input port, a sum output port, and a carry output port;
a first code converter having an input port and an output port, said input port of said first code converter coupled to said sum output port of said adder;
a second code converter having an input port and an output port, said input port of said second code converter coupled to said carry output port of said adder;
a minimum select circuit having a first input port, a second input port, and an output port, said first input port of said minimum select circuit coupled to said output port of said first code converter and said output port of said minimum select circuit coupled to said input port of said adder;
a first decision logic circuit having an input port and an output port, said input port of said first decision logic circuit coupled to said output port of said second code converter;
a delay circuit having an input port and an output port, said input port of said delay circuit coupled to said output port of said first decision logic circuit; and
a second decision logic circuit having an input port and an output port, said input port of said second decision logic circuit coupled to said output port of said delay circuit and said output port of said second decision logic circuit coupled to said second input port of said minimum select circuit,
wherein said first decision logic circuit and said second decision logic circuit are used to compute a preliminary decision value and a final decision value.

7. The add-compare-select circuit of claim 6, wherein the add-compare-select circuit forms part of an integrated circuit.

8. The add-compare-select circuit of claim 6, wherein the add-compare-select circuit forms part of a digital communications device.

9. The add-compare-select circuit of claim 6, wherein the add-compare-select circuit forms part of a Viterbi decoder.

10. The add-compare-select circuit of claim 6, wherein said first decision logic circuit and said second decision logic circuit each comprise a plurality of 2-to-1 multiplexers.

11. A digital communication device, comprising:
a branch metric circuit; and
an add-compare-select circuit coupled to said branch metric circuit, said add-compare-select circuit comprising
an adder having an input port, a sum output port, and a carry output port;
a first code converter having an input port and an output port, said input port of said first code converter coupled to said sum output port of said adder;
a second code converter having an input port and an output port, said input port of said second code converter coupled to said carry output port of said adder;
a maximum select circuit having a first input port, a second input port, and an output port, said first input port of said maximum select circuit coupled to said output port of said first code converter and said output port of said maximum select circuit coupled to said input port of said adder;
a first decision logic circuit having an input port and an output port, said input port of said first decision logic circuit coupled to said output port of said second code converter;
a delay circuit having an input port and an output port, said input port of said delay circuit coupled to said output port of said first decision logic circuit; and
a second decision logic circuit having an input port and an output port, said input port of said second decision logic circuit coupled to said output port of said delay circuit and said output port of said second decision logic circuit coupled to said second input port of said maximum select circuit,
wherein said first decision logic circuit and said second decision logic circuit are used to compute a preliminary decision value and a final decision value.

12. The device of claim 11, wherein the digital communication device is a receiver.

13. The device of claim 11, wherein the digital communication device is a decoder.

14. A digital communication device, comprising:
a branch metric circuit; and
an add-compare-select circuit coupled to said branch metric circuit, said add-compare-select circuit comprising
an adder having an input port, a sum output port, and a carry output port;
a first code converter having an input port and an output port, said input port of said first code converter coupled to said sum output port of said adder;
a second code converter having an input port and an output port, said input port of said second code converter coupled to said carry output port of said adder;
a minimum select circuit having a first input port, a second input port, and an output port, said first input port of said minimum select circuit coupled to said output port of said first code converter and said output port of said minimum select circuit coupled to said input port of said adder;
a first decision logic circuit having an input port and an output port, said input port of said first decision logic circuit coupled to said output port of said second code converter;
a delay circuit having an input port and an output port, said input port of said delay circuit coupled to said output port of said first decision logic circuit; and
a second decision logic circuit having an input port and an output port, said input port of said second decision logic circuit coupled to said output port of said delay circuit and said output port of said second decision logic circuit coupled to said second input port of said minimum select circuit,
wherein said first decision logic circuit and said second decision logic circuit are used to compute a preliminary decision value and a final decision value.

15. The device of claim 14, wherein the digital communication device is a receiver.

16. The device of claim 14, wherein the digital communication device is a decoder.

17. A method for designing an add-compare-select circuit, the method comprising:

selecting a number of bits (B) to be compared;

forming an initial most-significant-bit-first add-compare-select circuit capable of operating on B-bits;

identifying a critical path in the initial most-significant-bit-first add-compare-select circuit, the critical path having a processing time T;

dividing a sub-circuit of the initial most-significant-bit-first add-compare-select circuit into a first sub-circuit segment and a second sub-circuit segment, the divided sub-circuit forming part of the critical path;

adding a delay circuit between the first sub-circuit segment and the second sub-circuit segment to form a modified most-significant-bit-first add-compare-select circuit; and forming a clocking circuit to clock the modified most-significant-bit-first add-compare-select circuit, the clocking circuit having a clock period less than T.

18. The method of claim 17, wherein the initial most-significant-bit-first add-compare-select circuit includes a decision logic circuit that computes a final decision value and a preliminary decision value, and wherein said dividing step comprises:

dividing the decision logic circuit into the first sub-circuit segment and the second sub-circuit segment.

* * * * *

UNITED STATES PATENT AND TRADEMARK OFFICE
CERTIFICATE OF CORRECTION

| | | |
|---|---|---|
| PATENT NO. | : 7,020,831 B2 | Page 1 of 4 |
| APPLICATION NO. | : 10/318250 | |
| DATED | : March 28, 2006 | |
| INVENTOR(S) | : Keshab K. Parhi | |

It is certified that error appears in the above-identified patent and that said Letters Patent is hereby corrected as shown below:

The sheets of drawings consisting of figures 11, 20 and 22, should be deleted to appear as per attached sheets.

In Column 5, line 36, replace "$\gamma_0(n+^2)$" with -- $\gamma_0(n+2)$ --.

Signed and Sealed this

Twelfth Day of February, 2008

JON W. DUDAS
*Director of the United States Patent and Trademark Office*